US010059843B2

(12) United States Patent
Kuks et al.

(10) Patent No.: US 10,059,843 B2
(45) Date of Patent: *Aug. 28, 2018

(54) RHODAMINE DERIVATIVES DYES, COLOR-CONVERSION-LAYER AND USES THEREOF

(71) Applicant: StoreDot Ltd., Herzeliya (IL)

(72) Inventors: Evgenia Liel Kuks, Ramat Gan (IL); Rony Schwarz, Kibbutz Ma'anit (IL); Eran Sella, Tel-Aviv (IL); Mor Shmuel Armon, Ramat Gan (IL); Daniel Szwarcman, Pardes-Hanna Karkur (IL)

(73) Assignee: StoreDot Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,158

(22) Filed: Jun. 14, 2017

(65) Prior Publication Data

US 2017/0283616 A1 Oct. 5, 2017

Related U.S. Application Data

(63) Continuation of application No. 15/252,492, filed on Aug. 31, 2016, now Pat. No. 9,771,480.

(60) Provisional application No. 62/255,853, filed on Nov. 16, 2015.

(51) Int. Cl.
| | | |
|---|---|---|
| C07D 491/22 | (2006.01) | |
| H01L 51/00 | (2006.01) | |
| C09B 11/24 | (2006.01) | |
| G03F 7/00 | (2006.01) | |
| C09B 69/10 | (2006.01) | |
| F21V 9/16 | (2006.01) | |
| C09K 11/06 | (2006.01) | |
| C09B 69/00 | (2006.01) | |
| G02F 1/1335 | (2006.01) | |
| F21V 9/30 | (2018.01) | |

(52) U.S. Cl.
CPC ............ *C09B 11/24* (2013.01); *C09B 69/008* (2013.01); *C09B 69/103* (2013.01); *C09K 11/06* (2013.01); *F21V 9/16* (2013.01); *F21V 9/30* (2018.02); *G02F 1/133617* (2013.01); *G03F 7/0007* (2013.01); *H01L 51/0061* (2013.01); *H01L 51/0072* (2013.01); *C09K 2211/1048* (2013.01); *G02F 2001/133614* (2013.01)

(58) Field of Classification Search
USPC ............................................ 546/37; 313/504
See application file for complete search history.

(56) References Cited

U.S. PATENT DOCUMENTS

| | | | |
|---|---|---|---|
| 5,250,214 A * | 10/1993 | Kanemoto | C09K 19/3809 252/299.01 |
| 5,610,932 A | 3/1997 | Kessler et al. | |
| 5,686,261 A | 11/1997 | Zhang et al. | |
| 5,851,621 A | 12/1998 | Wolleb et al. | |
| 7,704,284 B2 | 4/2010 | Eliu et al. | |
| 8,163,910 B2 | 4/2012 | Lukhtanov | |
| 8,580,579 B2 | 11/2013 | Hell et al. | |
| 8,735,444 B2 | 5/2014 | Hell et al. | |
| 9,771,480 B2 | 9/2017 | Kuks et al. | |
| 9,868,859 B2 * | 1/2018 | Szwarcman | ........ C09B 67/0083 |
| 2004/0135502 A1 | 7/2004 | Kobayashi et al. | |
| 2004/0225037 A1 | 11/2004 | Lam et al. | |
| 2005/0170363 A1 | 8/2005 | Reddington et al. | |
| 2007/0134596 A1 | 6/2007 | Lungu | |
| 2009/0004462 A1 | 1/2009 | Zhang et al. | |
| 2009/0213296 A1 | 8/2009 | Park et al. | |
| 2009/0306277 A1 | 12/2009 | Goenner et al. | |
| 2010/0183805 A1 | 7/2010 | Nieminen | |
| 2010/0330380 A1 | 12/2010 | Colreavy et al. | |
| 2011/0082273 A1 | 4/2011 | Laas et al. | |
| 2012/0024345 A1 | 2/2012 | Reisfeld et al. | |
| 2012/0135459 A1 | 5/2012 | Hell et al. | |
| 2012/0138124 A1 | 6/2012 | Shmueli et al. | |
| 2014/0186679 A1 | 7/2014 | Archer et al. | |
| 2014/0208978 A1 | 7/2014 | Sunder et al. | |
| 2016/0146987 A1 | 5/2016 | Ito et al. | |
| 2016/0251516 A1 | 9/2016 | Sorenden et al. | |
| 2017/0037259 A1 | 2/2017 | Wang | |
| 2017/0137626 A1 | 5/2017 | Kuks et al. | |
| 2017/0137628 A1 | 5/2017 | Szwarcman et al. | |
| 2017/0137630 A1 | 5/2017 | Szwarcman et al. | |
| 2017/0137705 A1 | 5/2017 | Szwarcman et al. | |
| 2017/0139270 A1 | 5/2017 | Szwarcman et al. | |
| 2017/0139271 A1 | 5/2017 | Szwarcman et al. | |

(Continued)

FOREIGN PATENT DOCUMENTS

| | | |
|---|---|---|
| EP | 0 805 441 | 11/1997 |
| EP | 2253635 | 11/2010 |
| EP | 2 305 691 | 4/2011 |

(Continued)

OTHER PUBLICATIONS

Polyakova, SM. et al. New GM1 Ganglioside Derivatives for Selective Single and Double Labelling of the Natural Glycosphingolipid Skeleton. E. J. Org. 2009, p. 5168.*
Belov et al. "Rhodamine spiroamides for multicolor single-molecule switching fluorescent nanoscopy", Chemistry. Oct. 19, 2009;15(41):10762-76.
Drexhage, K. H. "Fluorescence efficiency of laser dyes. [Xanthenes, oxazines 7-aminocoumarins]" J. Res. Natl. Bur. Stand., A; 1976 vol. 80:3.
Mitronova et al. "New fluorinated rhodamines for optical microscopy and nanoscopy", Chemistry. Apr. 19, 2010;16(15):4477-88.
Pal et al. "Spectroscopic and photophysical properties of some new rhodamine derivatives in cationic, anionic and neutral micelles", Journal of Photochemistry and Photobiology A: Chemistry vol. 98, Issues 1-2, Aug. 2, 1996, pp. 65-72.
Ross et AL. "Facile Synthesis of Rhodamine Esters using Acetyl Chloride in Alcohol Solution", Journal Synthetic Communications vol. 36, 2006—Issue 12, p. 1745-1750.

(Continued)

*Primary Examiner* — Charanjit Aulakh
(74) *Attorney, Agent, or Firm* — Pearl Cohen Zedek Latzer Baratz LLP

(57) ABSTRACT

This invention is directed to photoluminescent compounds based on rhodamine dyes with red-shifted absorption and emission maxima and uses thereof for photoluminescence based devices.

11 Claims, 10 Drawing Sheets

(56) References Cited

U.S. PATENT DOCUMENTS

| | | | |
|---|---|---|---|
| 2017/0139277 | A1 | 5/2017 | Szwarcman et al. |
| 2018/0051174 | A1 | 2/2018 | Szwarcman et al. |

FOREIGN PATENT DOCUMENTS

| | | | |
|---|---|---|---|
| EP | 2752464 | | 7/2014 |
| JP | 62278570 | | 12/1987 |
| JP | 2005002290 | | 1/2005 |
| JP | 2006306933 | | 11/2006 |
| JP | 2012/233151 | | 11/2012 |
| JP | 2012233151 | A * | 11/2012 |
| WO | WO 00/64986 | | 11/2000 |
| WO | WO-2004/101709 | | 11/2004 |
| WO | WO 2010/149190 | | 12/2010 |
| WO | WO-2011/123820 | | 10/2011 |
| WO | WO-2013/056720 | | 4/2013 |
| WO | WO 2013/103158 | | 7/2013 |
| WO | WO-2015/016175 | | 2/2015 |
| WO | WO-2017085720 | | 5/2017 |

OTHER PUBLICATIONS

Sinel'Nikov et al. "Fluorescence of the lactone form of rhodamine B", Russian Journal of Physical Chemistry A Aug. 2013, vol. 87, Issue 8, pp. 1409-1416.
Soibinet et al. "Rhod-5N as a fluorescent molecular sensor of cadmium(II) ion", J Fluoresc. Nov. 2008;18(6):1077-82.
Uddin et al. "Synthesis of 5- and 6-carboxy-X-rhodamines", Org Lett. Nov. 6, 2008;10(21):4799-801.
Zhang et al. "Fluorescence lifetimes and quantum yields of ten rhodamine derivatives: Structural effect on emission mechanism in different solvents", Journal of Luminescence vol. 145, Jan. 2014, pp. 448-453.
Reisfeld. "Doped polymeric systems produced by sol-gel technology: optical properties and potential industrial applications", Polimery, Jan. 2006, vol. 51, No. 2, pp. 95-103.
Office action of U.S. Appl. No. 15/353,015, dated Apr. 6, 2017.
PCT Search Report of PCT Application No. PCT/IL2016/051234, dated Mar. 14, 2017.
Inoue et al. "Development of Color Resists Containing Novel Dyes for Liquid Crystal Displays" Sumitomo Chemical Co., Ltd., IT-Related Chemicals Research Laboratory, Nov. 25, 2013 pp. 1, 3-6; figures 3-7; table 2.
International Search Report of PCT Application No. PCT/IL2016/050951 dated Nov. 25, 2016.
Nguyen et al., "Practical Synthetic Route to Functionalized Rhodamine Dyes", Organic Letters, Sep. 1, 2003, vol. 5, No. 18, pp. 3245-3248.
Kolmakov et al. "Polar Red-Emitting Rhodamine Dyes with Reactive Groups: Synthesis, Photophysical Properies, and Two-Color STED Nanoscopy Applications", Chemistry—A European Journal, Dec. 11, 2013, vol. 20, No. 1, pp. 146-157.
Uddin et al. "Synthesis of 5- and 6-Carboxy-X-rhodamines", Organic Letters, Nov. 6, 2008, vol. 10, No. 21, pp. 4799-4801.
Gyuzel et al. "Functionalization of the meso-phenyl Ring of Rhodamine Dyes Trough S N Ar with Sulfur Nuclephiles: Synthesis, Biophysical Characterization, and Comprehensive NMR Analysis", European Journal of Organic Chemistry, Jan. 1, 2015, vol. 2015, No. 2, pp. 337-349.
U.S. Appl. No. 15/252,597, filed Aug. 31, 2016, Kuks et al.
U.S. Appl. No. 15/691,774, filed Aug. 31, 2017, Armon et al.
U.S. Appl. No. 15/691,775, filed Aug. 31, 2017, Szwarcman et al.
U.S. Appl. No. 15/691,776, filed Aug. 31, 2017, Kuks et al.
International Search Report for PCT application No. PCT/IL2016/051234, dated Mar. 14, 2017.
Reisfeld, Reneta. Doped polymeric systems produced by sol-gel technology: optical properties and potential indusrial applications. Polimery-Warsaw, 2006, 51.2: 95. Dec. 1, 2006.

Inoue et al."Development of Color Resists Containing Novel Dyes for Liquid Crystal Displays" translated from R&D Report, "Sumitomo Kagaku", Nov. 35, 2013, pp. 1-7.
"Rhodamine Dyes", IUPAC Gold Book, 1995, accessed Aug. 7, 2017.
Office Action of U.S Appl. No. 15/415,886 dated Aug. 11, 2017.
Lakowicz, "Principles of Fluorescence Spectroscopy", Springer, third edition, 2006.
Kobayashi et al. "LCD Backlights", Wiley, 2009.
Mottran et al. "Hydrophobic analogues of rhodamine B and rhodamine 101: potent fluorescent probes of mitochondria in living C. elegans", Beilstein J. Org. Chem. 2012, vol. 8, pp. 2156-2165.
Kim et al. "Sol-Gel Derived Transparent Zirconium-Phenyl Siloxane Hybrid for Robust High Refractive Index LED Encapsulant" ACS Applied Materials & Interfaces, Feb. 24, 2014, vol. 6, No. 5, pp. 3115-3121.
Madsen et al. "Synthesis of Rhodamine 6G-Based Compounds for the ATRP Biocompatible polymers", Biomacromolecules, Jun. 13, 2011, vol. 12, No. 6, pp. 2225-2234.
International Search Report of PCT Application No. PCT/IL2016/050955 dated Nov. 23, 2016.
Reisfeld et al. "Solid-state lasers based on inorganic-organic hybrid materials obtained by combined sol-gel polymer technology", Polym. Adv. Technol., May 19, 2004, vol. 15, No. 6, pp. 291-301.
Kazes et al. "Organic-Inorganic Sol-Gel Composites Incorporating Semiconductor Nanocrystals for Optical Gain Applications", Advanced Materials, May 4, 2009, vol. 21, No. 17, pp. 1716-1720.
Kazes et al. "Blue laser dye spectroscopic properties in solgel inorganic-organic hybrid films", Optics Letters, Feb. 1, 2006, vol. 31, No. 3, pp. 356-358.
Deshpande et al. "Efficient lasing acting from Rhodamine-110 (RH-110) impregnated sol-gel silica samples prepared by dip method", Journal of Luminescence, May 2010, vol. 130, No. 5, pp. 839-844.
Yariv et al. "Efficiency and photostabilty of dye-doped solid-state lasers in different hosts" Optical Materials, Feb. 2001, vol. 16. No. 1-2, pp. 29-38.
Geffroy et al. "Organic light-emitting diode (OLED) technology: materials, devices and display technologies", Polymer International, 2006, vol. 55, pp. 572-582.
Liu et al. "Manipulation of exciton distribution for high-performance fluorescent/phosphorescent hybrid white organic light-emitting diodes", Journal of Materials Chemistry C, 2017, vol. 5, pp. 7668-7683.
Reineke et al. "White organic light-emitting diodes: Status and perspective", Reviews of Modern Physics, Jul. 30, 2013, vol. 85, No. 3, pp. 1245-1293.
Polyakova et al. "New GM1 Ganglioside Derivatives for Selective Single and Double Labelling of the Natural Glycosphingolipid Skeleton", Eur. J. Org. Chem., 2009, pp. 5162-5177.
Jbeily et al. "Synthesis of fluorinated rhodamines and application for confocal laser scanning microscopy", Journal of Fluorine Chemistry, 2016, pp. 70-78.
Grimm et al. "A general method to fine-tune fluorophores for live-cell and in vivo imaging", Nature Methods, 14, Sep. 4, 2017, pp. 987-994 (2017).
Grimm et al. "A general method to improve fluorophores for live-cell and single-molecule microscopy", Nature Methods, Mar. 2015, vol. 12, No. 3, pp. 244-250.
Office action of U.S. Appl. No. 15/691,776 dated Feb. 14, 2018.
Edman, P., "Extended Forster theory of donor-donor energy migration in bifluorophoric macromolecules. PartII. Method for determining intramolecular distances with experimental validation using mono and bifluorophoric systems." Physical Chemistry Chemical Physics 2000, 2, p. 2795-2801.
Chemical Abstracts Service 2018 American Chemical Society Registry Excerpts p. 1.
SciFinder 2018, American Chemical Society (ACS) Registry Excerpts, 24 pages.
Notice of Allowance for U.S. Appl. No. 15/691,774, dated Apr. 3, 2018.
U.S. Office Action for U.S. Appl. No. 15/785,443, dated May 3, 2018.
U.S. Office Action for U.S. Appl. No. 15/661,151, dated Jul. 3, 2018.

* cited by examiner

RHODAMINE DERIVATIVES DYES, COLOR-CONVERSION-LAYER AND USES THEREOF

CROSS REFERENCE TO RELATED APPLICATIONS

This application is a continuation of U.S. application Ser. No. 15/252,492, filed Aug. 31, 2016, which claims the benefit of U.S. Provisional Ser. No. 62/255,853, filed on Nov. 16, 2015 both of which are incorporated in their entirety herein by reference.

FIELD OF THE INVENTION

This invention is directed to photoluminescent compounds based on rhodamine dyes with red-shifted absorption and emission maxima and uses thereof for photoluminescence based devices.

BACKGROUND OF THE INVENTION

Xanthene derived dyes are known to be efficient fluorescent dyes. Functional groups on the conjugated moiety of the dye (chromophore) have the ability to fine tune the dye's fluorescent colors.

Some xanthene derived dyes are the Rhodamine dyes. These compounds can be regarded as diaminated analogs of xanthene (at the positions 6' and 3'; see below for further elaboration on the numbering convention of rhodamine) which has been also arylated at the 9' position. Rhodamines fluoresce have been used extensively in research, both as free dye and as conjugates to larger molecules, e.g. proteins and antibodies as biomarkers.

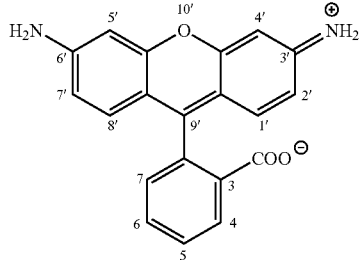

Rhodamines are outstanding versatile organic dyes. They demonstrate thermal and photochemical stability, strongly absorb visible light, and show high fluorescence quantum yields. Rhodamine based compounds have been utilized as industrial dyes, electronic materials, medical devices, bio markers, lighting devices, sensors and photovoltaics. Within the rhodamine family of compounds, one of the commonly used fluorescent rhodamine dye is rhodamine 6G (other examples include sulforhodamine 101 and rhodamine 101) which has high quantum yield and high photostability, rendering it a suitable compound in optical and electro optical applications, as well as biotechnological applications.

There is a significant need for new fluorescent dyes with superior optical and electro optical parameters such as fluorescence intensity, quantum yield and photostability, as basis for novel (bio)optical and (bio)electro-optical devices.

SUMMARY OF THE INVENTION

In one embodiment, this invention is directed to a photoluminescent compound represented by the structure of formula (I):

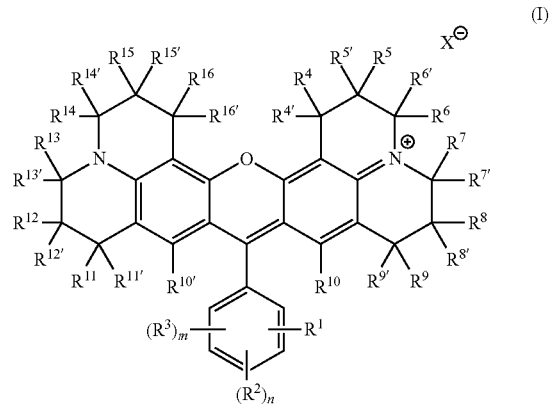

wherein $R^1$ is COOZ, $NO_2$, COR, COSR, $CON(R)_2$, or CN;

$R^2$ each is independently selected from H, halide, COR, CN, $CON(R)_2$, CO(N-heterocycle), NCO, NCS, OR, SR, $SO_3H$, $SO_3M$ and COOZ;

$R^3$ each is independently selected from H, halide, COR, CN, $CON(R)_2$, CO(N-heterocycle), NCO, NCS, OR, SR, $SO_3H$, $SO_3M$ and COOZ;

$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;

R is H, alkyl, cycloalkyl, heterocycloalkyl, aryl, benzyl, —$(CH_2CH_2O)_rCH_2CH_2OH$, —$(CH_2)_pOC(O)NH(CH_2)_q Si(Oalkyl)_3$, —$(CH_2)_pOC(O)CH=CH_2$ or —$(CH_2)_pSi(Oalkyl)_3$;

Z is alkyl, cycloalkyl, heterocycloalkyl, aryl, benzyl, —$(CH_2CH_2O)_rCH_2CH_2OH$, —$(CH_2)_pOC(O)NH(CH_2)_q Si(Oalkyl)_3$, —$(CH_2)_pOC(O)CH=CH_2$ or —$(CH_2)_pSi(Oalkyl)_3$;

n and m are each independently an integer between 1-4;

p and q is each independently an integer between 1-6;

r is an integer between 0-10;

M is a monovalent cation; and

X is an anion;

wherein if $R^2$ and $R^3$ are hydrogens (H), then $R^1$ at position 3 is not COOZ.

In one embodiment, this invention is directed to a photoluminescent compound represented by the structure of formula (VI):

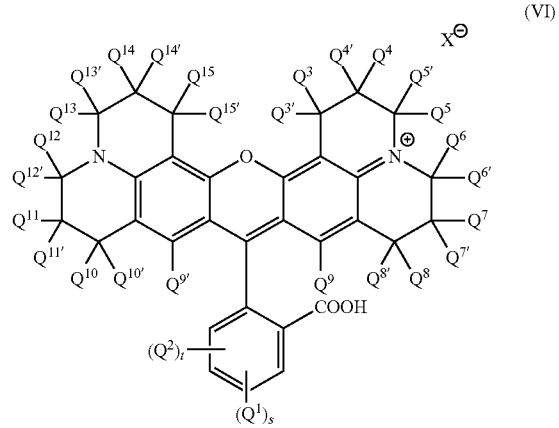

(VI)

wherein
$Q^1$ each is independently selected from halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-Heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^2$ each is independently selected from halide, haloalkyl, Tosylate, Mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-Heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$, $Q^{3'}$, $Q^8$, $Q^{8'}$, $Q^{10}$, $Q^{10'}$, $Q^{15}$, $Q^{15'}$ are each independently selected from alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

$Q^4$-$Q^7$, $Q^9$, $Q^{9'}$, $Q^{11}$-$Q^{14}$, $Q^{4'}$-$Q^{7'}$, $Q^{11'}$-$Q^{14'}$ are each independently selected from H, alkyl, cycloalkyl, heterocyloalkyl, aryl, benzyl, halide, $NO_2$, OQ, $N(Q)_2$, COQ, CN, $CON(Q)_2$, CO(N-Heterocycle) and COOQ;

Q is H, alkyl, cycloalkyl, heterocycloalkyl, aryl, benzyl, —$(CH_2CH_2O)_rCH_2CH_2OH$, —$(CH_2)_pOC(O)NH(CH_2)_q$ $Si(Oalkyl)_3$, —$(CH_2)_pOC(O)CH=CH_2$ or —$(CH_2)_pSi(Oalkyl)_3$;

M is a monovalent cation;
s and t are independently an integer between 1-4;
p and q are independently an integer between 1-6;
r is an integer between 0-10; and
X is an anion.

In one embodiment, this invention provides a photoluminescent device comprising a color-conversion-layer comprising a photoluminescent compound of this invention. In another embodiment, the photoluminescent device is integrated in a backlight unit of a LCD display.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
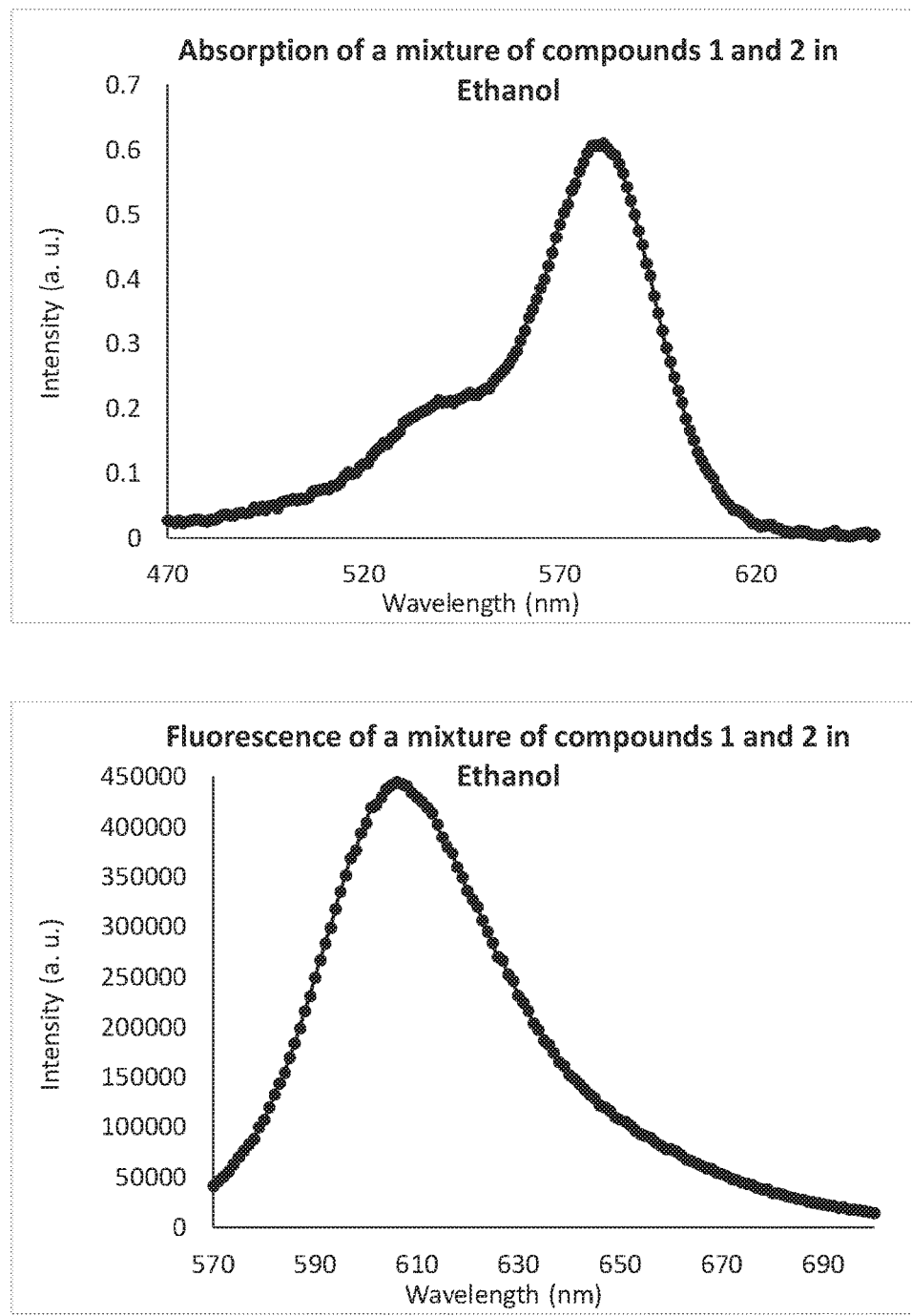
FIG. 1 depicts absorption and emission spectra of a mixture of compounds 1 and 2 in ethanol, wherein the mixture absorbs at 579 nm and emits at 606 nm

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Photoluminescent materials refer to any material that absorbs light energy and then release that energy in the form of light. There are two types of photoluminescence: fluorescence and phosphorescence.

Fluorescent materials absorb light and then emit light instantaneously at a different wavelength. Fluorescent materials are used as light conversion emitters to modify the spectral response of light sources. Fluorescent compounds convert all or part of the light (depending on the absorbance coefficient and quantum yield of the molecule) absorbed in a certain energy interval to radiate it at longer wavelengths. This approach is used to fabricate or modify light sources that emit in the visible spectral range (light wavelengths between 400 and 800 nm). These latter sources are used in lighting devices that produce visible light. Examples of such lighting devices are fluorescent tubes, fluorescent compact lamps, or ultraviolet-based white light emitting diodes, where the ultraviolet radiation, invisible to the human eye, is converted by fluorescent materials into visible light with a spectral distribution between 400 and 800 nm.

Phosphorescent materials absorb light of short wavelength and then emit light slowly over time also at a different, longer wavelength.

In one embodiment, this invention is directed to a photoluminescent compound.

In one embodiment, this invention is directed to a fluorescent compound.

In one embodiment, this invention is directed to photoluminescent compounds based on rhodamine dyes with red-shifted absorption and emission maxima.

Rhodamine having a carboxyphenyl fragment can be in one of three forms, depending on the pH, temperature, properties of the solvent, its polarity, and the concentration of the solution: cationic (+), zwitterion (±) or lactone. Each form has its own characteristic spectral-luminescent properties. While rhodamine derivatives in cationic and zwitterionic forms represents highly fluorescent molecules, the interruption of π-conjugation of the chromophore of the zwitterionic form, leads to formation of the non-fluorescent lactone. Consequently, absorption of lactones of rhodamine occurs in the UV spectral region and the fluorescence quantum yield and lifetime are very low.

Mitronova et al. *Chem. Eur. J.* 2010, 16, 4477-4488; Soibinet et. al. *J. Fluoresc.* 2008, 18, 1077-1082, *J. Photochem. Photobio. A.:Chemistry,* 1996, 98, 65-72). These properties make the above mentioned materials as good candidate for high brightness and wide color gamut display.

In one embodiment, this invention is directed to a photoluminescent compound represented by the structure of formula (I):

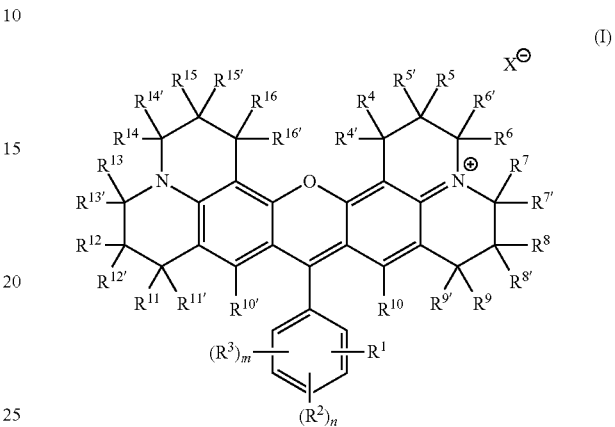

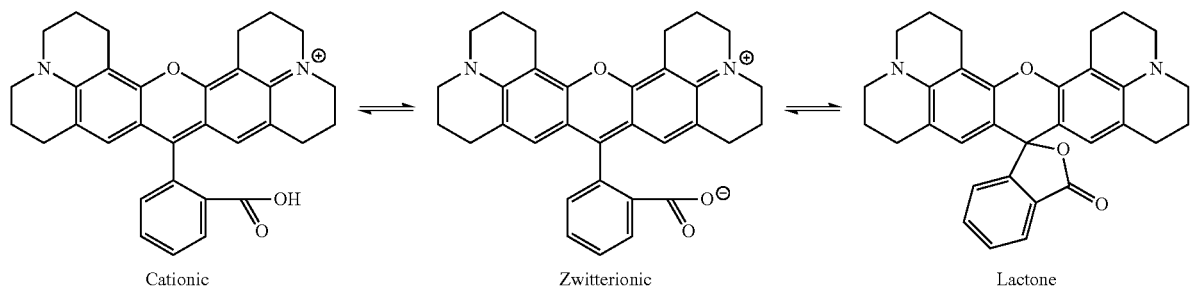 [SMILES: O=C(O)c1ccccc1C1=c2cc3c4c(c2Oc2c1cc1c5c2CCCN5CCC1)CCC[N+]=4CCC3 ; O=C([O-])c1ccccc1C1=c2cc3c4c(c2Oc2c1cc1c5c2CCCN5CCC1)CCC[N+]=4CCC3 ; O=C1OC2(c3ccccc31)c1cc3c4c(c1Oc1c2cc2c5c1CCCN5CCC2)CCCN4CCC3]

In one embodiment, the compounds of this invention do not form a lactone at the 3-position of a rhodamine derivative, by having an ester group or an amide group at position 3 of the rhodamine, or by having an electron withdrawing group which is different from a carboxylate or carboxylic acid at position 3 of the rhodamine.

A bathochromic shift of between 0-5 nm, caused by esterification or amidation of 3-carboxy-rhodamine is known (Journal of Luminescence, 2014, 145, 448-453). No shift was observed with amidated 5-carboxy-rhodamine or 6-carboxy-rhodamine derivatives, while other carboxylic acids on the rhodamine remained unchanged (Org. Lett. 2008, 10, 4799-4801).

Surprisingly and unexpectedly, multiple-esterified compounds of this invention provided a large red shift of between 9 nm to 25 nm. Moreover, incorporation of electron withdrawing substituents on the phenyl ring lead to red shift, while mono- and multiple-esterification of the compounds of this invention yielded a further bathochromic shift of between 9 nm to 40 nm. Furthermore, high quantum yields in addition to narrow FWHM (Full Width at Half Maximum) values are found in the esterified compounds of this invention in contrast to numerous known cases in which modification of the rhodamine skeleton resulted in reduced quantum yields and increased FWHM values (Gyuzel Yu.

wherein
$R^1$ is COOZ, $NO_2$, COR, COSR, $CON(R)_2$, or CN;
$R^2$ each is independently selected from H, halide, COR, CN, $CON(R)_2$, CO(N-heterocycle), NCO, NCS, OR, SR, $SO_3H$, $SO_3M$ and COOZ;
$R^3$ each is independently selected from H, halide, COR, CN, $CON(R)_2$, CO(N-heterocycle), NCO, NCS, OR, SR, $SO_3H$, $SO_3M$ and COOZ;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-Heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_q Si(Oalkyl)_3$, —$(CH_2)_pOC(O)CH=CH_2$ or —$(CH_2)_pSi(Oalkyl)_3$;
Z is alkyl, cycloalkyl, heterocycloalkyl, aryl, benzyl, —$(CH_2CH_2O)_rCH_2CH_2OH$, —$(CH_2)_pOC(O)NH(CH_2)_q Si(Oalkyl)_3$, —$(CH_2)_pOC(O)CH=CH_2$ or —$(CH_2)_pSi(Oalkyl)_3$;
n and m are each independently an integer between 1-4;
p and q are each independently an integer between 1-6;
r is an integer between 0-10;
M is a monovalent cation; and
X is an anion;

wherein if $R^2$ and $R^3$ are hydrogens (H), then $R^1$ at position 3 is not COOZ.

In one embodiment, this invention is directed to a photoluminescent device comprising a photoluminescent compound represented by the structure of formula (I), wherein:
$R^1$ is COOR, $NO_2$, COR, COSR, CO(N-heterocycle), $CON(R)_2$, or CN;
$R^2$ each is independently selected from H, halide, $N(R)_2$, COR, CN, $CON(R)_2$, CO(N-heterocycle), NCO, NCS, OR, SR, $SO_3H$, $SO_3M$ and COOR;
$R^3$ each is independently selected from H, halide, $N(R)_2$, COR, CN, $CON(R)_2$, CO(N-heterocycle), NCO, NCS, OR, SR, $SO_3H$, $SO_3M$ and COOR;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-Heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
n and m are each independently an integer between 1-4;
p and q are each independently an integer between 1-6;
r is an integer between 0-10;
M is a monovalent cation; and
X is an anion.

In one embodiment, this invention is directed to a photoluminescent compound represented by the structure of formula (II):

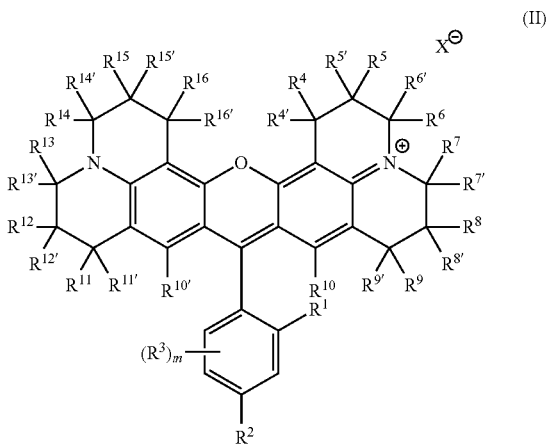

(II)

wherein
$R^1$ is COOZ, $NO_2$, COR, COSR, $CON(R)_2$, or CN;
$R^2$ is independently selected from H, halide, COR, CN, $CON(R)_2$, CO(N-heterocycle), NCO, NCS, OR, SR, $SO_3H$, $SO_3M$ and COOZ;
$R^3$ each is independently selected from H, halide, COR, CN, $CON(R)_2$, CO(N-heterocycle), NCO, NCS, OR, SR, $SO_3H$, $SO_3M$ and COOZ;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
Z is alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
m is an integer between 1-4;
p and q are each independently an integer between 1-6;
r is an integer between 0-10;
M is a monovalent cation; and
X is an anion;
wherein if $R^2$ and $R^3$ are hydrogens (H), then $R^1$ at position 3 is not COOZ.

In one embodiment, this invention is directed to a photoluminescent device comprising a photoluminescent compound represented by the structure of formula (II), wherein:
$R^1$ is COOR, $NO_2$, COR, COSR, $CON(R)_2$, CO(N-heterocycle), or CN;
$R^2$ is independently selected from H, halide, COR, CN, $CON(R)_2$, CO(N-heterocycle), NCO, NCS, $N(R)_2$, OR, SR, $SO_3H$, $SO_3M$ and COOR;
$R^3$ each is independently selected from H, halide, COR, CN, $CON(R)_2$, CO(N-heterocycle), NCO, NCS, $N(R)_2$, OR, SR, $SO_3H$, $SO_3M$ and COOR;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
Z is alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
m is an integer between 1-4;
p and q are each independently an integer between 1-6;
r is an integer between 0-10;
M is a monovalent cation;
and
X is an anion.

In one embodiment, this invention is directed to a photoluminescent compound represented by the structure of formula (III):

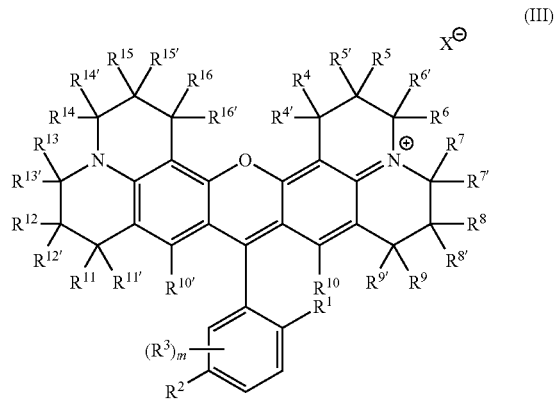

(III)

wherein
$R^1$ is COOZ, $NO_2$, COR, COSR, $CON(R)_2$, or CN;
$R^2$ is independently selected from H, halide, COR, CN, $CON(R)_2$, CO(N-heterocycle), NCO, NCS, OR, SR, $SO_3H$, $SO_3M$ and COOZ;

$R^3$ each is independently selected from H, halide, COR, CN, $CON(R)_2$, CO(N-heterocycle), NCO, NCS, OR, SR, $SO_3H$, $SO_3M$ and COOZ;

$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;

R is H, alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

Z is alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

m is an integer between 1-4;

p and q are each independently an integer between 1-6;

r is an integer between 0-10;

M is a monovalent cation;

and

X is an anion;

wherein if $R^2$ and $R^3$ are hydrogens (H), then $R^1$ at position 3 is not COOZ.

In one embodiment, this invention is directed to a photoluminescent device comprising a photoluminescent compound represented by the structure of formula (III), wherein:

$R^1$ is COOR, $NO_2$, COR, COSR, CO(N-heterocycle), $CON(R)_2$, or CN;

$R^2$ is independently selected from H, halide, COR, CN, $CON(R)_2$, CO(N-heterocycle), $N(R)_2$, NCO, NCS, OR, SR, $SO_3H$, $SO_3M$ and COOR;

$R^3$ each is independently selected from H, halide, COR, CN, $CON(R)_2$, CO(N-heterocycle), NCO, $N(R)_2$, NCS, OR, SR, $SO_3H$, $SO_3M$ and COOR;

$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;

R is H, alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

Z is alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

m is an integer between 1-4;

p and q are each independently an integer between 1-6;

r is an integer between 0-10;

M is a monovalent cation;

and

X is an anion.

In one embodiment, this invention is directed to a photoluminescent compound represented by the structure of formula (IV):

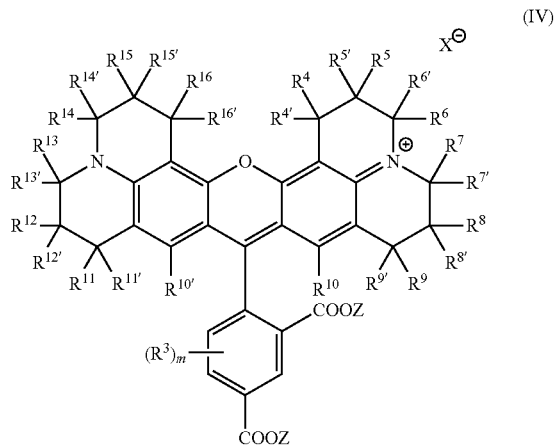

wherein $R^3$ each is independently selected from H, halide, COR, CN, $CON(R)_2$, CO(N-heterocycle), NCO, NCS, OR, SR, $SO_3H$, $SO_3M$ and COOZ;

$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;

R is H, alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

Z is alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

m is an integer between 1-4;

p and q are each independently an integer between 1-6;

r is an integer between 0-10;

M is a monovalent cation;

and

X is an anion.

In one embodiment, this invention is directed to a photoluminescent device comprising a photoluminescent compound represented by the structure of formula (IV), wherein:

$R^3$ each is independently selected from H, halide, COR, CN, $CON(R)_2$, CO(N-heterocycle), NCO, NCS, OR, SR, $SO_3H$, $SO_3M$ and COOZ;

$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;

R is H, alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

Z is H, alkyl, cycloalkyl, heterocycloalkyl, aryl, benzyl, —$(CH_2CH_2O)_rCH_2CH_2OH$, —$(CH_2)_pOC(O)NH(CH_2)_q$$Si(Oalkyl)_3$, —$(CH_2)_pOC(O)CH{=}CH_2$ or —$(CH_2)_pSi(Oalkyl)_3$;

m is an integer between 1-4;

p and q are each independently an integer between 1-6;

r is an integer between 0-10;

M is a monovalent cation; and
X is an anion.

In one embodiment, this invention is directed to a photoluminescent compound represented by the structure of formula (V):

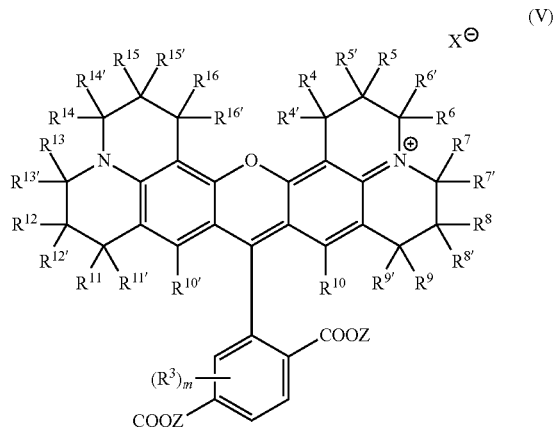

(V)

wherein
$R^3$ each is independently selected from H, halide, COR, CN, $CON(R)_2$, CO(N-heterocycle), NCO, NCS, OR, SR, $SO_3H$, $SO_3M$ and COOZ;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_q$ $Si(Oalkyl)_3$, —$(CH_2)_pOC(O)CH=CH_2$ or —$(CH_2)_pSi(Oalkyl)_3$;
Z is alkyl, cycloalkyl, heterocycloalkyl, aryl, benzyl, —$(CH_2CH_2O)_rCH_2CH_2OH$, —$(CH_2)_pOC(O)NH(CH_2)_q$ $Si(Oalkyl)_3$, —$(CH_2)_pOC(O)CH=CH_2$ or —$(CH_2)_pSi(Oalkyl)_3$;
m is an integer between 1-4;
p and q are each independently an integer between 1-6;
r is an integer between 0-10;
M is a monovalent cation; and
X is an anion.

In one embodiment, this invention is directed to a photoluminescent device comprising a photoluminescent compound represented by the structure of formula (V), wherein:
$R^3$ each is independently selected from H, halide, COR, CN, $CON(R)_2$, CO(N-heterocycle), NCO, NCS, OR, SR, $SO_3H$, $SO_3M$ and COOZ;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, CN, $CON(R)_2$, CO(N-heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_q$ $Si(Oalkyl)_3$, —$(CH_2)_pOC(O)CH=CH_2$ or —$(CH_2)_pSi(Oalkyl)_3$;
Z is H, alkyl, cycloalkyl, heterocycloalkyl, aryl, benzyl, —$(CH_2CH_2O)_rCH_2CH_2OH$, —$(CH_2)_pOC(O)NH(CH_2)_q$ $Si(Oalkyl)_3$, —$(CH_2)_pOC(O)CH=CH_2$ or —$(CH_2)_pSi(Oalkyl)_3$;
m is an integer between 1-4;
p and q are each independently an integer between 1-6;
r is an integer between 0-10;
M is a monovalent cation; and
X is an anion.

In one embodiment, this invention is directed to a photoluminescent compound represented by the structure of formula (VI):

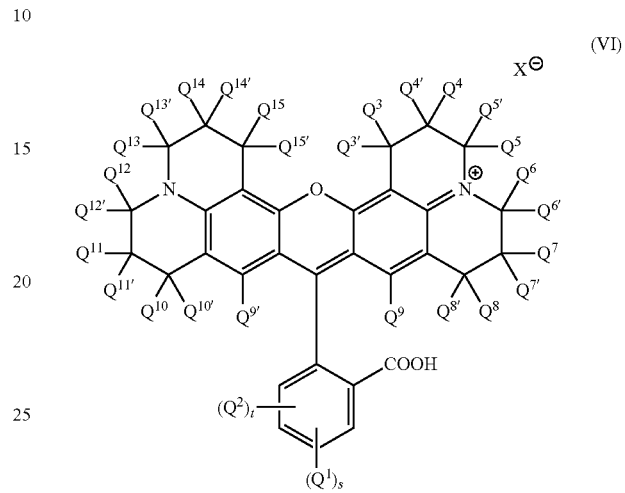

(VI)

wherein
$Q^1$ each is independently selected from halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;
$Q^2$ each is independently selected from halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;
$Q^3$, $Q^{3'}$, $Q^8$, $Q^{8'}$, $Q^{10}$, $Q^{10'}$, $Q^{15}$, $Q^{15'}$ are each independently selected from alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;
$Q^4$-$Q^7$, $Q^9$, $Q^{9'}$, $Q^{11}$-$Q^{14}$, $Q^{4'}$-$Q^{7'}$, $Q^{11'}$-$Q^{14'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;
Q is H, alkyl, cycloalkyl, heterocycloalkyl, aryl, benzyl, —$(CH_2CH_2O)_rCH_2CH_2OH$, —$(CH_2)_pOC(O)NH(CH_2)_q$ $Si(Oalkyl)_3$, —$(CH_2)_pOC(O)CH=CH_2$ or —$(CH_2)_pSi(Oalkyl)_3$;
M is a monovalent cation;
s and t are independently an integer between 1-4;
p and q are independently an integer between 1-6;
r is an integer between 0-10; and
X is an anion.

In one embodiment, this invention is directed to a photoluminescent device comprising a photoluminescent compound represented by the structure of formula (VI), wherein:
$Q^1$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^2$ each is independently selected from H, halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^3$-$Q^{15}$ and $Q^{3'}$-$Q^{15'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

Q is H, alkyl, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, —(CH$_2$)$_p$OC(O)CH=CH$_2$ or —(CH$_2$)$_p$Si(Oalkyl)$_3$;

M is a monovalent cation;

s and t are independently an integer between 1-4;

p and q are independently an integer between 1-6;

r is an integer between 0-10; and

X is an anion.

In another embodiment, this invention is directed to a photoluminescent compound of formula (VII):

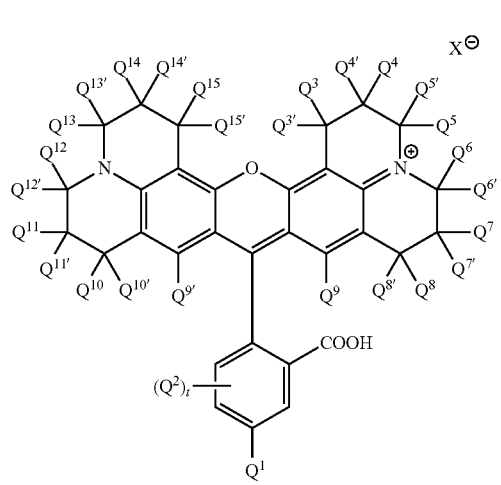

(VII)

wherein $Q^1$ is halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ or OPO(OH)$_2$;

$Q^2$ each is independently selected from halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^3$, $Q^{3'}$, $Q^8$, $Q^{8'}$, $Q^{10}$, $Q^{10'}$, $Q^{15}$, $Q^{15'}$ are each independently selected from alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

$Q^4$-$Q^7$, $Q^9$, $Q^{9'}$, $Q^{11}$-$Q^{14}$, $Q^{4'}$-$Q^{7'}$, $Q^{11'}$-$Q^{14'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

Q is H, alkyl, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, —(CH$_2$)$_p$OC(O)CH=CH$_2$ or —(CH$_2$)$_p$Si(Oalkyl)$_3$;

M is a monovalent cation;

t is an integer between 1-3;

p and q are independently an integer between 1-6;

r is an integer between 0-10; and

X is an anion.

In one embodiment, this invention is directed to a photoluminescent device comprising a photoluminescent compound represented by the structure of formula (VII), wherein:

$Q^1$ is H, halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ or OPO(OH)$_2$;

$Q^2$ each is independently selected from H, halide, haloalkyl, tosylate, mesylate, SO$_2$NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)$_2$, CO(N-heterocycle), NO, NO$_2$, N(Q)$_2$, SO$_3$H, SO$_3$M, SO$_2$Q, SO$_2$M, SOQ, PO(OH)$_2$ and OPO(OH)$_2$;

$Q^3$-$Q^{15}$ and $Q^{3'}$-$Q^{15'}$ are each independently selected from H, alkyl, cycloalkyl, heterocycloalkyl, aryl, benzyl, halide, NO$_2$, OQ, N(Q)$_2$, COQ, CN, CON(Q)$_2$, CO(N-heterocycle) and COOQ;

Q is H, alkyl, cycloalkyl, heterocycloalkyl, aryl, benzyl, —(CH$_2$CH$_2$O)$_r$CH$_2$CH$_2$OH, —(CH$_2$)$_p$OC(O)NH(CH$_2$)$_q$Si(Oalkyl)$_3$, —(CH$_2$)$_p$OC(O)CH=CH$_2$ or —(CH$_2$)$_p$Si(Oalkyl)$_3$;

M is a monovalent cation;

t is an integer between 1-3;

p and q are independently an integer between 1-6;

r is an integer between 0-10; and

X is an anion.

In one embodiment, this invention is directed to a photoluminescent compound represented by the structure of formula (VIII):

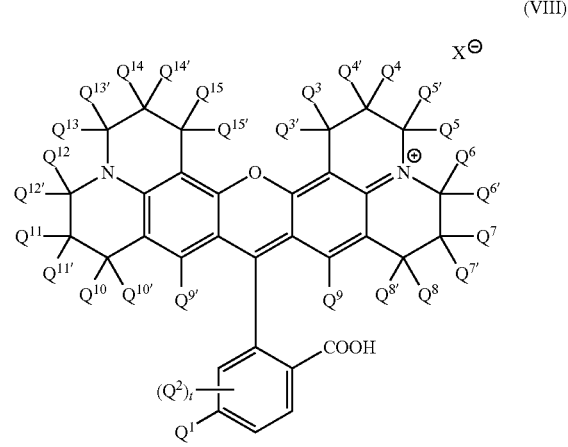

(VIII)

wherein $Q^1$ is halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ or $OPO(OH)_2$;

$Q^2$ each is independently selected from halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$-$Q^{15}$ and $Q^{3'}$-$Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, $-(CH_2CH_2O)_rCH_2CH_2OH$, $-(CH_2)_pOC(O)NH(CH_2)_qSi(Oalkyl)_3$, $-(CH_2)_pOC(O)CH=CH_2$ or $-(CH_2)_pSi(Oalkyl)_3$;

M is a monovalent cation;

t is an integer between 1-3;

p and q are independently an integer between 1-6;

r is an integer between 0-10; and

X is an anion.

In one embodiment, this invention is directed to a photoluminescent device comprising a photoluminescent compound represented by the structure of formula (VIII), wherein:

$Q^1$ is H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ or $OPO(OH)_2$;

$Q^2$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$-$Q^{15}$ and $Q^{3'}$-$Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, $-(CH_2CH_2O)_rCH_2CH_2OH$, $-(CH_2)_pOC(O)NH(CH_2)_qSi(Oalkyl)_3$, $-(CH_2)_pOC(O)CH=CH_2$ or $-(CH_2)_pSi(Oalkyl)_3$;

M is a monovalent cation;

t is an integer between 1-3;

p and q are independently an integer between 1-6;

r is an integer between 0-10; and

X is an anion.

In one embodiment, this invention is directed to a photoluminescent compound represented by the structure of formula (IX):

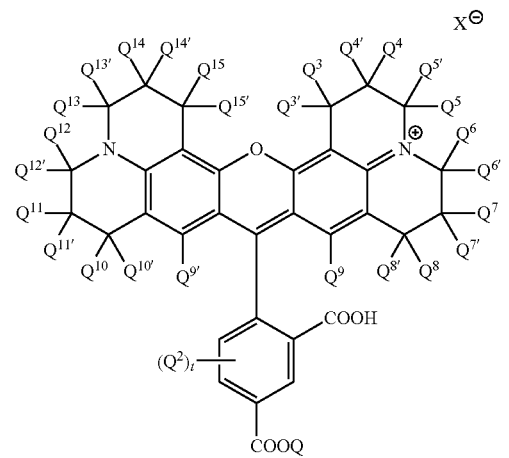

(IX)

wherein:

$Q^2$ each is independently selected from halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, and $PO(OH)_2$ $OPO(OH)_2$;

$Q^3$-$Q^{15}$ and $Q^{3'}$-$Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, $-(CH_2CH_2O)_rCH_2CH_2OH$, $-(CH_2)_pOC(O)NH(CH_2)_qSi(Oalkyl)_3$, $-(CH_2)_pOC(O)CH=CH_2$ or $-(CH_2)_pSi(Oalkyl)_3$;

M is a monovalent cation;

t is an integer between 1-3;

p and q are independently an integer between 1-6;

r is an integer between 0-10; and

X is an anion.

In one embodiment, this invention is directed to a photoluminescent device comprising a photoluminescent compound represented by the structure of formula (IX), wherein:

$Q^2$ each is independently selected from H, halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-heterocycle), NO, $NO_2$, $N(Q)_2$, $SO_3H$, $SO_3M$, $SO_2Q$, $SO_2M$, SOQ, $PO(OH)_2$ and $OPO(OH)_2$;

$Q^3$-$Q^{15}$ and $Q^{3'}$-$Q^{15'}$ are each independently selected from H, alkyl, cycloalkyl, heterocycloalkyl, aryl, benzyl, halide, $NO_2$, OQ, $N(Q)_2$, COQ, CN, $CON(Q)_2$, CO(N-heterocycle) and COOQ;

Q is H, alkyl, cycloalkyl, heterocycloalkyl, aryl, benzyl, $-(CH_2CH_2O)_rCH_2CH_2OH$, $-(CH_2)_pOC(O)NH(CH_2)_qSi(Oalkyl)_3$, $-(CH_2)_pOC(O)CH=CH_2$ or $-(CH_2)_pSi(Oalkyl)_3$;

M is a monovalent cation;

t is an integer between 1-3;

p and q are independently a integer between 1-6;

r is an integer between 0-10; and

X is an anion.

In one embodiment, this invention is directed to a photoluminescent compound represented by the structure of formula (X):

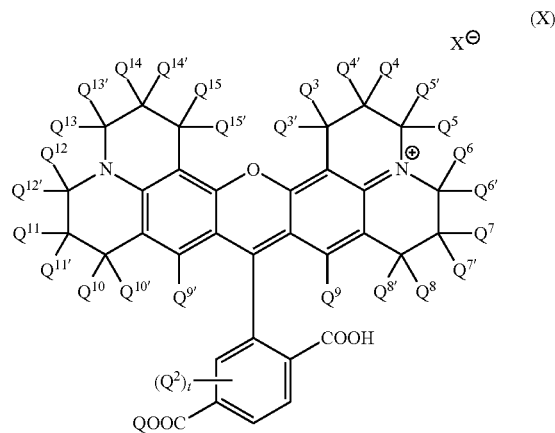

wherein
Q² each is independently selected from halide, haloalkyl, tosylate, mesylate, SO₂NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)₂, CO(N-heterocycle), NO, NO₂, N(Q)₂, SO₃H, SO₃M, SO₂Q, SO₂M, SOQ, PO(OH)₂ and OPO(OH)₂;
$Q^3$-$Q^{15}$ and $Q^{3'}$-$Q^{15'}$ are each independently selected from H, alkyl, cycloalkyl, heterocycloalkyl, aryl, benzyl, halide, NO₂, OQ, N(Q)₂, COQ, CN, CON(Q)₂, CO(N-heterocycle) and COOQ;
Q is H, alkyl, cycloalkyl, heterocycloalkyl, aryl, benzyl, —(CH₂CH₂O)$_r$CH₂CH₂OH, —(CH₂)$_p$OC(O)NH(CH₂)$_q$Si(Oalkyl)₃, —(CH₂)$_p$OC(O)CH=CH₂ or —(CH₂)$_p$Si(Oalkyl)₃;
M is a monovalent cation;
t is an integer between 1-3;
p and q are independently an integer between 1-6;
r is an integer between 0-10; and
X is an anion.

In one embodiment, this invention is directed to a photoluminescent device comprising a photoluminescent compound represented by the structure of formula (IX), wherein:
Q² each is independently selected from H, halide, haloalkyl, tosylate, mesylate, SO₂NHQ, triflate, isocyante, cyanate, thiocyanate, isothiocyanate, COQ, COCl, COOCOQ, COOQ, OCOQ, OCONHQ, NHCOOQ, NHCONHQ, OCOOQ, CN, CON(Q)₂, CO(N-heterocycle), NO, NO₂, N(Q)₂, SO₃H, SO₃M, SO₂Q, SO₂M, SOQ, PO(OH)₂ and OPO(OH)₂;
$Q^3$-$Q^{15}$ and $Q^{3'}$-$Q^{15'}$ are each independently selected from H, alkyl, cycloalkyl, heterocycloalkyl, aryl, benzyl, halide, NO₂, OQ, N(Q)₂, COQ, CN, CON(Q)₂, CO(N-heterocycle) and COOQ;
Q is H, alkyl, cycloalkyl, heterocycloalkyl, aryl, benzyl, —(CH₂CH₂O)$_r$CH₂CH₂OH, —(CH₂)$_p$OC(O)NH(CH₂)$_q$Si(Oalkyl)₃, —(CH₂)$_p$OC(O)CH=CH₂ or —(CH₂)$_p$Si(Oalkyl)₃;
M is a monovalent cation;
t is an integer between 1-3;
p and q are independently an integer between 1-6;
r is an integer between 0-10; and
X is an anion.

In one embodiment, $R^1$, is COOZ, NO₂, COR, COSR, CON(R)₂, or CN. In another embodiment, $R^1$ is COOZ. In another embodiment, $R^1$ is NO₂. In another embodiment, $R^1$ is COR. In another embodiment, $R^1$ is COSR. In another embodiment, $R^1$ is CON(R)₂. In another embodiment, $R^1$ is CO(N-heterocycle). In another embodiment, $R^1$ is CN.

In one embodiment, R is H, alkyl, cycloalkyl, heterocycloalkyl, aryl, benzyl, —(CH₂CH₂O)$_r$CH₂CH₂OH, —(CH₂)$_p$ OC(O)NH(CH₂)$_q$Si(Oalkyl)₃, —(CH₂)$_p$OC(O) CH=CH₂, —(CH₂)$_p$Si(Oalkyl)₃, wherein p is an integer between 1-6, q is an integer between 1-6 and r is an integer between 0-10. In another embodiment, R is H. In another embodiment, R is an alkyl. In another embodiment, R is a cycloalkyl. In another embodiment, R is a heterocycloalkyl. In another embodiment, R is an aryl. In another embodiment, R is a benzyl. In another embodiment, R is —(CH₂)$_p$ OC(O)NH(CH₂)$_q$Si(Oalkyl)₃. In another embodiment, R is —(CH₂)₂ OC(O)NH(CH₂)₃Si(OEt)₃. In another embodiment, R is —(CH₂)$_p$OC(O)CH=CH₂. In another embodiment, R is —(CH₂)₄OC(O)CH=CH₂. In another embodiment, R is —(CH₂)$_p$Si(Oalkyl)₃.

In one embodiment, Z is alkyl, cycloalkyl, heterocycloalkyl, aryl, benzyl, —(CH₂CH₂O)$_r$CH₂CH₂OH, —(CH₂)$_p$ OC(O)NH(CH₂)$_q$Si(Oalkyl)₃, —(CH₂)$_p$OC(O) CH=CH₂, —(CH₂)$_p$Si(Oalkyl)₃, wherein p is an integer between 1-6, q is an integer between 1-6 and r is an integer between 0-10. In another embodiment, Z is an alkyl. In another embodiment, Z is a cycloalkyl. In another embodiment, Z is a heterocycloalkyl. In another embodiment, Z is an aryl. In another embodiment, Z is a benzyl. In another embodiment, Z is —(CH₂)$_p$OC(O)NH(CH₂)$_q$Si(Oalkyl)₃. In another embodiment, Z is —(CH₂)₂OC(O)NH(CH₂)₃Si (OEt)₃. In another embodiment, Z is —(CH₂)$_p$OC(O) CH=CH₂. In another embodiment, Z is —(CH₂)₄OC(O) CH=CH₂. In another embodiment, Z is —(CH₂)$_p$Si (Oalkyl)₃.

In one embodiment, $R^2$ is H, halide, N(R)₂, COR, CN, CON(R)₂, CO(N-heterocycle), NCO, NCS, OR, SR, SO₃H, SO₃M or COOZ. In another embodiment, $R^2$ is H. In another embodiment, $R^2$ is halide. In another embodiment, $R^2$ is N(R)₂. In another embodiment, $R^2$ is COR. In another embodiment, $R^2$ is CN. In another embodiment, $R^2$ is CON (R)₂. In another embodiment, $R^2$ is CO(N-heterocycle). In another embodiment, $R^2$ is NCO. In another embodiment, $R^2$ is NCS. In another embodiment, $R^2$ is OR. In another embodiment, $R^2$ is SR. In another embodiment, $R^2$ is SO₃H. In another embodiment, $R^2$ is SO₃M. In another embodiment, $R^2$ is COOZ.

In one embodiment, $R^3$ is H, halide, N(R)₂, COR, CN, CON(R)₂, CO(N-Heterocycle), NCO, NCS, OR, SR, SO₃H, SO₃M or COOZ. In another embodiment, $R^3$ is H. In another embodiment, $R^3$ is halide. In another embodiment, $R^3$ is N(R)₂. In another embodiment, $R^3$ is COR. In another embodiment, $R^3$ is CN. In another embodiment, $R^3$ is CON (R)₂. In another embodiment, $R^3$ is CO(N-heterocycle). In another embodiment, $R^3$ is NCO. In another embodiment, $R^3$ is NCS. In another embodiment, $R^3$ is OR. In another embodiment, $R^3$ is SR. In another embodiment, $R^3$ is SO₃H. In another embodiment, $R^3$ is SO₃M. In another embodiment, $R^3$ is COOZ.

In one embodiment, $R^4$, $R^{4'}$, $R^9$, $R^{9'}$, $R^{11}$, $R^{11'}$, $R^{16}$, $R^{16'}$ are each independently selected from H, alkyl, cycloalkyl, heterocycloalkyl, aryl, benzyl, halide, N(R)₂, NO₂, COR, CN, CON(R)₂, CO(N-heterocycle) and COOR. In another embodiment, $R^4$, $R^{4'}$, $R^9$, $R^{9'}$, $R^{11}$, $R^{11'}$, $R^{16}$ and/or $R^{16'}$ is H. In another embodiment, $R^4$, $R^{4'}$, $R^9$, $R^{9'}$, $R^{11}$, $R^{11'}$, $R^{16}$ and/or $R^{16'}$ is alkyl. In another embodiment, $R^4$, $R^{4'}$, $R^9$, $R^{9'}$, $R^{11}$, $R^{11'}$, $R^{16}$ and/or $R^{16'}$ is cycloalkyl. In another embodiment, $R^4$, $R^{4'}$, $R^9$, $R^{9'}$, $R^{11}$, $R^{11'}$, and/or $R^{16'}$ is heterocycloalkyl. In another embodiment, $R^4$, $R^{4'}$, $R^9$, $R^{9'}$, $R^{11}$, $R^{11'}$, $R^{16}$ and/or $R^{16'}$ is aryl. In another embodiment, $R^4$, $R^{4'}$, $R^9$, $R^{9'}$, $R^{11}$, $R^{11'}$, $R^{16}$ and/or $R^{16'}$ is benzyl. In another embodiment, $R^4$, $R^{4'}$, $R^9$, $R^{9'}$, $R^{11}$, $R^{11'}$, $R^{16}$ and/or $R^{16'}$ is halide. In another embodiment, $R^4$, $R^{4'}$, $R^9$, $R^{9'}$, $R^{11}$, $R^{11'}$, $R^{16}$ and/or $R^{16'}$ is $N(R)_2$. In another embodiment, $R^4$, $R^{4'}$, $R^9$, $R^{9'}$, $R^{11}$, $R^{11'}$, $R^{16}$ or $R^{16'}$ is $NO_2$. In another embodiment, $R^4$, $R^{4'}$, $R^9$, $R^{9'}$, $R^{11}$, $R^{11'}$, $R^{16}$ and/or $R^{16'}$ is COR. In another embodiment, $R^4$, $R^{4'}$, $R^9$, $R^{9'}$, $R^{11}$, $R^{11'}$, $R^{16}$ and/or $R^{16'}$ is CN. In another embodiment, $R^4$, $R^{4'}$, $R^9$, $R^{9'}$, $R^{11}$, $R^{11'}$, $R^{16}$ and/or $R^{16'}$ is $CON(R)_2$. In another embodiment, $R^4$, $R^{4'}$, $R^9$, $R^{9'}$, $R^{11}$, $R^{11'}$, $R^{16}$ and/or $R^{16'}$ is CO(N-heterocycle). In another embodiment, $R^4$, $R^{4'}$, $R^9$, $R^{9'}$, $R^{11}$, $R^{11'}$, $R^{16}$ and/or $R^{16'}$ is COOR.

In one embodiment, $R^5$, $R^{5'}$, $R^8$, $R^{8'}$, $R^{12}$, $R^{12'}$, $R^{15}$, $R^{15'}$ are each independently selected from H, alkyl, cycloalkyl, heterocycloalkyl, aryl, benzyl, halide, $N(R)_2$, $NO_2$, COR, CN, $CON(R)_2$, CO(N-heterocycle) and COOR. In another embodiment, $R^5$, $R^{5'}$, $R^8$, $R^{8'}$, $R^{12}$, $R^{12'}$, $R^{15}$ and/or $R^{15'}$ is H. In another embodiment, $R^5$, $R^{5'}$, $R^8$, $R^{8'}$, $R^{12}$, $R^{12'}$, $R^{15}$ and/or $R^{15'}$ is alkyl. In another embodiment, $R^5$, $R^{5'}$, $R^8$, $R^{8'}$, $R^{12}$, $R^{12'}$, $R^{15}$ and/or $R^{15'}$ is cycloalkyl. In another embodiment, $R^5$, $R^{5'}$, $R^8$, $R^{8'}$, $R^{12}$, $R^{12'}$, $R^{15}$ and/or $R^{15'}$ is heterocycloalkyl. In another embodiment, $R^5$, $R^{5'}$, $R^8$, $R^{8'}$, $R^{12}$, $R^{12'}$, $R^{15}$ and/or $R^{15'}$ is aryl. In another embodiment, $R^5$, $R^{5'}$, $R^8$, $R^{8'}$, $R^{12}$, $R^{12'}$, $R^{15}$ and/or $R^{15'}$ is benzyl. In another embodiment, $R^5$, $R^{5'}$, $R^8$, $R^{8'}$, $R^{12}$, $R^{12'}$, $R^{15}$ and/or $R^{15'}$ is halide. In another embodiment, $R^5$, $R^{5'}$, $R^8$, $R^{8'}$, $R^{12}$, $R^{12'}$, $R^{15}$ and/or $R^{15'}$ is $N(R)_2$. In another embodiment, $R^5$, $R^{5'}$, $R^8$, $R^{8'}$, $R^{12}$, $R^{12'}$, $R^{15}$ and/or $R^{15'}$ is $NO_2$. In another embodiment, $R^5$, $R^{5'}$, $R^8$, $R^{8'}$, $R^{12}$, $R^{12'}$, $R^{15}$ and/or $R^{15'}$ is COR. In another embodiment, $R^5$, $R^{5'}$, $R^8$, $R^{8'}$, $R^{12}$, $R^{12'}$, $R^{15}$ and/or $R^{15'}$ is CN. In another embodiment, $R^5$, $R^{5'}$, $R^8$, $R^{8'}$, $R^{12}$, $R^{12'}$, $R^{15}$ and/or $R^{15'}$ is $CON(R)_2$. In another embodiment, $R^5$, $R^{5'}$, $R^8$, $R^{8'}$, $R^{12}$, $R^{12'}$, $R^{15}$ and/or $R^{15'}$ is CO(N-heterocycle). In another embodiment, $R^5$, $R^{5'}$, $R^8$, $R^{8'}$, $R^{12}$, $R^{12'}$, $R^{15}$ $R^{15}$ and/or $R^{15'}$ is COOR.

In one embodiment, $R^6$, $R^{6'}$, $R^7$, $R^{7'}$, $R^{13}$, $R^{13'}$, $R^{14}$, $R^{14'}$ are each independently selected from is H, alkyl, cycloalkyl, heterocycloalkyl, aryl, benzyl, halide, $N(R)_2$, $NO_2$, COR, CN, $CON(R)_2$, CO(N-Heterocycle) and COOR. In another embodiment, $R^6$, $R^{6'}$, $R^7$, $R^{7'}$, $R^{13}$, $R^{13'}$, $R^{14}$ and/or $R^{14'}$ is H. In another embodiment, $R^6$, $R^{6'}$, $R^7$, $R^{7'}$, $R^{13}$, $R^{13'}$, $R^{14}$ and/or $R^{14'}$ is alkyl. In another embodiment, $R^6$, $R^{6'}$, $R^7$, $R^{7'}$, $R^{13}$, $R^{13'}$, $R^{14}$ and/or $R^{14'}$ is cycloalkyl. In another embodiment, $R^6$, $R^{6'}$, $R^7$, $R^{7'}$, $R^{13}$, $R^{13'}$, $R^{14}$ and/or $R^{14'}$ is heterocycloalkyl. In another embodiment, $R^6$, $R^{6'}$, $R^7$, $R^{7'}$, $R^{13}$, $R^{13'}$, $R^{14}$ and/or $R^{14'}$ is aryl. In another embodiment, $R^6$, $R^{6'}$, $R^7$, $R^{7'}$, $R^{13}$, $R^{13'}$, $R^{14}$ and/or $R^{14'}$ is benzyl. In another embodiment, $R^6$, $R^{6'}$, $R^7$, $R^{7'}$, $R^{13}$, $R^{13'}$, $R^{14}$ and/or $R^{14'}$ is halide. In another embodiment, $R^6$, $R^{6'}$, $R^7$, $R^{7'}$, $R^{13}$, $R^{13'}$, $R^{14}$ and/or $R^{14'}$ is $N(R)_2$. In another embodiment, $R^6$, $R^{6'}$, $R^7$, $R^{7'}$, $R^{13}$, $R^{13'}$, $R^{14}$ and/or $R^{14'}$ is $NO_2$. In another embodiment, $R^6$, $R^{6'}$, $R^7$, $R^{7'}$, $R^{13}$, $R^{13'}$, $R^{14}$ and/or $R^{14'}$ is COR. In another embodiment, $R^6$, $R^{6'}$, $R^7$, $R^{7'}$, $R^{13}$, $R^{13'}$, $R^{14}$ and/or $R^{14'}$ is CN. In another embodiment, $R^6$, $R^{6'}$, $R^7$, $R^{7'}$, $R^{13}$, $R^{13'}$, $R^{14}$ and/or $R^{14'}$, is $CON(R)_2$. In another embodiment, $R^6$, $R^{6'}$, $R^7$, $R^{7'}$, $R^{13}$, $R^{13'}$, $R^{14}$ and/or $R^{14'}$ is CO(N-heterocycle). In another embodiment, $R^6$, $R^{6'}$, $R^7$, $R^{7'}$, $R^{13}$, $R^{13'}$, $R^{14}$ and/or $R^{14'}$, is COOR.

In one embodiment, $R^{10}$ is H, alkyl, cycloalkyl, heterocycloalkyl, aryl, benzyl, halide, $N(R)_2$, $NO_2$, COR, CN, $CON(R)_2$, CO(N-heterocycle) or COOR. In another embodiment, $R^{10}$ is H. In another embodiment, $R^{10}$ is alkyl. In another embodiment, $R^{10}$ is cycloalkyl. In another embodiment, $R^{10}$ is alkyl. In another embodiment, $R^{10}$ is heterocycloalkyl. In another embodiment, $R^{10}$ is aryl. In another embodiment, $R^{10}$ is benzyl. In another embodiment, $R^{10}$ is halide. In another embodiment, $R^{10}$ is $N(R)_2$. In another embodiment, $R^{10}$ is $NO_2$. In another embodiment, $R^{10}$ is COR. In another embodiment, $R^{10}$, is CN. In another embodiment, $R^{10}$, is $CON(R)_2$. In another embodiment, $R^{10}$ is CO(N-heterocycle). In another embodiment, $R^{10}$, is COOR.

In one embodiment, $R^{10'}$ is H, alkyl, cycloalkyl, heterocycloalkyl, aryl, benzyl, halide, $N(R)_2$, $NO_2$, COR, CN, $CON(R)_2$, CO(N-heterocycle) or COOR In another embodiment, $R^{10'}$ is H. In another embodiment, $R^{10'}$ is alkyl. In another embodiment, $R^{10'}$ is cycloalkyl. In another embodiment, $R^{10'}$ is alkyl. In another embodiment, $R^{10'}$ is heterocycloalkyl. In another embodiment, $R^{10'}$ is aryl. In another embodiment, $R^{10'}$ is benzyl. In another embodiment, $R^{10'}$ is halide. In another embodiment, $R^{10'}$ is $N(R)_2$. In another embodiment, $R^{10'}$ is $NO_2$. In another embodiment, $R^{10'}$ is COR. In another embodiment, $R^{10'}$, is CN. In another embodiment, $R^{10'}$, is $CON(R)_2$. In another embodiment, $R^{10'}$ is CO(N-heterocycle). In another embodiment, $R^{10'}$, is COOR.

In one embodiment, $Q^1$ is halide, haloalkyl, tosylate, mesylate, $SO_2NHQ$, triflate, isocyante, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-Heterocycle), NO, $NO_2$, $N(Q)_2$, $SO_3H$, $SO_3M$, $SO_2Q$, $SO_2M$, SOQ, $PO(OH)_2$ or $OPO(OH)_2$. In another embodiment, $Q^1$ is halide In another embodiment, $Q^1$ is halogenated alkyl. In another embodiment, $Q^1$ is tosylate. In another embodiment, $Q^1$ is mesylate. In another embodiment, $Q^1$ is $SO_2NHQ$. In another embodiment, $Q^1$ is triflate. In another embodiment, $Q^1$ is isocyante. In another embodiment, $Q^1$ is cyanate. In another embodiment, $Q^1$ is thiocyanate. In another embodiment, $Q^1$ is isothiocyanate. In another embodiment, $Q^1$ is COQ. In another embodiment, $Q^1$ is COCl. In another embodiment, $Q^1$ is COOCOQ. In another embodiment, $Q^1$ is COOQ. In another embodiment, $Q^1$ is OCOQ. In another embodiment, $Q^1$ is OCONHQ. In another embodiment, $Q^1$ is NHCOOQ. In another embodiment, $Q^1$ is NHCONHQ. In another embodiment $Q^1$ is OCOOQ. In another embodiment, $Q^1$ is CN. In another embodiment, $Q^1$ is $CON(Q)_2$. In another embodiment, $Q^1$ is CO(N-heterocycle). In another embodiment, $Q^1$ is NO. In another embodiment, $Q^1$ is $NO_2$. In another embodiment, $Q^1$ is $N(Q)_2$. In another embodiment, $Q^1$ is $SO_3H$. In another embodiment, $Q^1$ is $SO_3M$. In another embodiment, $Q^1$ is $SO_2Q$. In another embodiment, $Q^1$ is $SO_2M$. In another embodiment, $Q^1$ is SOQ. In another embodiment, $Q^1$ is $PO(OH)_2$. In another embodiment, $Q^1$ is $OPO(OH)_2$.

In one embodiment, Q is Q is H, alkyl, cycloalkyl, heterocycloalkyl, aryl, benzyl, $-(CH_2CH_2O)_rCH_2CH_2OH$, $-(CH_2)_pOC(O)NH(CH_2)_qSi(Oalkyl)_3$, $-(CH_2)_pOC(O)CH=CH_2$ or $-(CH_2)_pSi(Oalkyl)_3$; wherein p is an integer between 1-6, q is an integer between 1-6 and r is an integer between 0-10. In another embodiment, Q is an H. In another embodiment, Q is an alkyl. In another embodiment, Q is a cycloalkyl. In another embodiment, Q is a heterocycloalkyl. In another embodiment, Q is an aryl. In another embodiment, Q is a benzyl. In another embodiment, Q is $-(CH_2)_pOC(O)NH(CH_2)_qSi(Oalkyl)_3$. In another embodiment, Q is $-(CH_2)_2OC(O)NH(CH_2)_3Si(OEt)_3$. In another embodiment, Q is $-(CH_2)_pOC(O)CH=CH_2$. In another embodiment, Q is $-(CH_2)_4OC(O)CH=CH_2$. In another embodiment, Q is $-(CH_2)_pSi(Oalkyl)_3$.

In one embodiment, $Q^2$ is halide, haloalkyl, tosylate, mesylate, $SO_2NHQ$, triflate, isocyate, cyanate, thiocyanate, isothiocyanate, COQ, COCl, COOCOQ, COOQ, OCOQ, OCONHQ, NHCOOQ, NHCONHQ, OCOOQ, CN, $CON(Q)_2$, CO(N-Heterocycle), NO, $NO_2$, $N(Q)_2$, $SO_3H$, $SO_3M$, $SO_2Q$, $SO_2M$, $SOQ$, $PO(OH)_2$ or $OPO(OH)_2$. In another embodiment, $Q^2$ is halide. In another embodiment, $Q^2$ is halogenated alkyl. In another embodiment, $Q^2$ is tosylate. In another embodiment, $Q^2$ is mesylate. In another embodiment, $Q^2$ is $SO_2NHQ$. In another embodiment, $Q^2$ is triflate. In another embodiment, $Q^2$ is isocyante. In another embodiment, $Q^2$ is cyanate. In another embodiment, $Q^2$ is thiocyanate. In another embodiment, $Q^2$ is isothiocyanate. In another embodiment, $Q^2$ is COQ. In another embodiment, $Q^2$ is COCl. In another embodiment, $Q^2$ is COOCOQ. In another embodiment, $Q^2$ is COOQ. In another embodiment, $Q^2$ is OCOQ. In another embodiment, $Q^2$ is OCONHQ. In another embodiment, $Q^2$ is NHCOOQ. In another embodiment, $Q^2$ is NHCONHQ. In another embodiment $Q^2$ is OCOOQ. In another embodiment, $Q^2$ is CN. In another embodiment, $Q^2$ is $CON(Q)_2$. In another embodiment, $Q^2$ is CO(N-Heterocycle). In another embodiment, $Q^2$ is NO. In another embodiment, $Q^2$ is $NO_2$. In another embodiment, $Q^2$ is $N(Q)_2$. In another embodiment, $Q^2$ is $SO_3H$. In another embodiment, $Q^2$ is $SO_3M$. In another embodiment, $Q^2$ is $SO_2Q$. In another embodiment, $Q^2$ is $SO_2M$. In another embodiment, $Q^2$ is SOQ. In another embodiment, $Q^2$ is $PO(OH)_2$. In another embodiment, $Q^2$ is $OPO(OH)_2$.

In one embodiment, $Q^3$, $Q^{3'}$, $Q^8$, $Q^{8'}$, $Q^{10}$, $Q^{10'}$, $Q^{15}$, $Q^{15'}$ are each independently selected from H, alkyl, cycloalkyl, heterocycloalkyl, aryl, benzyl, halide, $N(Q)_2$, $NO_2$, COR, CN, $CON(Q)_2$, CO(N-heterocycle) and COOQ. In another embodiment, $Q^3$, $Q^{3'}$, $Q^8$, $Q^{8'}$, $Q^{10}$, $Q^{10'}$, $Q^{15}$ and/or $Q^{15'}$ is H. In another embodiment, $Q^3$, $Q^{3'}$, $Q^8$, $Q^{8'}$, $Q^{10}$, $Q^{10'}$, $Q^{15}$ and/or $Q^{15'}$ is alkyl. In another embodiment, $Q^3$, $Q^{3'}$, $Q^8$, $Q^{8'}$, $Q^{10}$, $Q^{10'}$, $Q^{15}$ and/or $Q^{15'}$ is cycloalkyl. In another embodiment, $Q^3$, $Q^{3'}$, $Q^8$, $Q^{8'}$, $Q^{10}$, $Q^{10'}$, $Q^{15}$ and/or $Q^{15'}$ is alkyl. In another embodiment, $Q^3$, $Q^{3'}$, $Q^8$, $Q^{8'}$, $Q^{10}$, $Q^{10'}$, $Q^{15}$ and/or $Q^{15'}$ is heterocycloalkyl. In another embodiment, $Q^3$, $Q^{3'}$, $Q^8$, $Q^{8'}$, $Q^{10}$, $Q^{10'}$, $Q^{15}$ and/or $Q^{15'}$ is aryl. In another embodiment, $Q^3$, $Q^{3'}$, $Q^8$, $Q^{8'}$, $Q^{10}$, $Q^{10'}$, $Q^{15}$ and/or $Q^{15'}$ is benzyl. In another embodiment, $Q^3$, $Q^{3'}$, $Q^8$, $Q^{8'}$, $Q^{10}$, $Q^{10'}$, $Q^{15}$ and/or $Q^{15'}$ is halide. In another embodiment, $Q^3$, $Q^{3'}$, $Q^8$, $Q^{8'}$, $Q^{10}$, $Q^{10'}$, $Q^{15}$ and/or $Q^{15'}$ is $N(Q)_2$. In another embodiment, $Q^3$, $Q^{3'}$, $Q^8$, $Q^{8'}$, $Q^{10}$, $Q^{10'}$, $Q^{15}$ and/or $Q^{15'}$ is $NO_2$. In another embodiment, $Q^3$, $Q^{3'}$, $Q^8$, $Q^{8'}$, $Q^{10}$, $Q^{10'}$, $Q^{15}$ and/or $Q^{15'}$ is COQ. In another embodiment, $Q^3$, $Q^{3'}$, $Q^8$, $Q^{8'}$, $Q^{10}$, $Q^{10'}$, $Q^{15}$ and/or $Q^{15'}$ is CN. In another embodiment, $Q^3$, $Q^{3'}$, $Q^8$, $Q^{8'}$, $Q^{10}$, $Q^{10'}$, $Q^{15}$ and/or $Q^{15'}$, is $CON(Q)_2$. In another embodiment, $Q^3$, $Q^{3'}$, $Q^8$, $Q^{8'}$, $Q^{10}$, $Q^{10'}$, $Q^{15}$ and/or $Q^{15'}$ is CO(N-heterocycle). In another embodiment, $Q^3$, $Q^{3'}$, $Q^8$, $Q^{8'}$, $Q^{10}$, $Q^{10'}$, $Q^{15}$ and/or $Q^{15'}$, is COOQ.

In one embodiment, $Q^4$, $Q^{4'}$, $Q^7$, $Q^{7'}$, $Q^{11}$, $Q^{11'}$, $Q^{14}$, $Q^{14'}$ are each independently selected from H, alkyl, cycloalkyl, heterocycloalkyl, aryl, benzyl, halide, $N(Q)_2$, $NO_2$, COR, CN, $CON(Q)_2$, CO(N-heterocycle) and COOQ. In another embodiment, $Q^4$, $Q^{4'}$, $Q^7$, $Q^{7'}$, $Q^{11}$, $Q^{11'}$, $Q^{14}$ and/or $Q^{14'}$ is H. In another embodiment, $Q^4$, $Q^{4'}$, $Q^7$, $Q^{7'}$, $Q^{11}$, $Q^{11'}$, $Q^{14}$ and/or $Q^{14'}$ is alkyl. In another embodiment, $Q^4$, $Q^{4'}$, $Q^7$, $Q^{7'}$, $Q^{11}$, $Q^{11'}$, $Q^{14}$ and/or $Q^{14'}$ is cycloalkyl. In another embodiment, $Q^4$, $Q^{4'}$, $Q^7$, $Q^{7'}$, $Q^{11}$, $Q^{11'}$, $Q^{14}$ and/or $Q^{14'}$ is alkyl. In another embodiment, $Q^4$, $Q^{4'}$, $Q^7$, $Q^{7'}$, $Q^{11}$, $Q^{11'}$, $Q^{14}$ and/or $Q^{14'}$ is heterocycloalkyl. In another embodiment, $Q^4$, $Q^{4'}$, $Q^7$, $Q^{7'}$, $Q^{11}$, $Q^{11'}$, $Q^{14}$ and/or $Q^{14'}$ is aryl. In another embodiment, $Q^4$, $Q^{4'}$, $Q^7$, $Q^{7'}$, $Q^{11}$, $Q^{11'}$, $Q^{14}$ and/or $Q^{14'}$ is benzyl. In another embodiment, $Q^4$, $Q^{4'}$, $Q^7$, $Q^{7'}$, $Q^{11}$, $Q^{11'}$, $Q^{14}$ and/or $Q^{14'}$ is halide. In another embodiment, $Q^4$, $Q^{4'}$, $Q^7$, $Q^{7'}$, $Q^{11}$, $Q^{11'}$, $Q^{14}$ and/or $Q^{14'}$ is $N(Q)_2$. In another embodiment, $Q^4$, $Q^{4'}$, $Q^7$, $Q^{7'}$, $Q^{11}$, $Q^{11'}$, $Q^{14}$ and/or $Q^{14'}$ is $NO_2$. In another embodiment, $Q^4$ is COQ. In another embodiment, $Q^4$, $Q^{4'}$, $Q^7$, $Q^{7'}$, $Q^{11}$, $Q^{11'}$, $Q^{14}$ and/or $Q^{14'}$ is CN. In another embodiment, $Q^4$, $Q^{4'}$, $Q^7$, $Q^{7'}$, $Q^{11}$, $Q^{11'}$, $Q^{14}$ and/or $Q^{14'}$ is $CON(Q)_2$. In another embodiment, $Q^4$, $Q^{4'}$, $Q^7$, $Q^{7'}$, $Q^{11}$, $Q^{11'}$, $Q^{14}$ and/or $Q^{14'}$ is CO(N-heterocycle). In another embodiment, $Q^4$, $Q^{4'}$, $Q^7$, $Q^{7'}$, $Q^{11}$, $Q^{11'}$, $Q^{14}$ and/or $Q^{14'}$ is COOQ.

In one embodiment, $Q^5$, $Q^{5'}$, $Q^6$, $Q^{6'}$, $Q^{12}$, $Q^{12'}$, $Q^{13}$, $Q^{13'}$ are each independently selected from H, alkyl, cycloalkyl, heterocycloalkyl, aryl, benzyl, halide, $N(Q)_2$, $NO_2$, COR, CN, $CON(Q)_2$, CO(N-heterocycle) and COOQ. In another embodiment, $Q^5$, $Q^{5'}$, $Q^6$, $Q^{6'}$, $Q^{12}$, $Q^{12'}$, $Q^{13}$ and/or $Q^{13'}$ is H. In another embodiment, $Q^5$, $Q^{5'}$, $Q^6$, $Q^{6'}$, $Q^{12}$, $Q^{12'}$, $Q^{13}$ and/or $Q^{13'}$ is alkyl. In another embodiment, $Q^5$, $Q^{5'}$, $Q^6$, $Q^{6'}$, $Q^{12}$, $Q^{12'}$, $Q^{13}$ and/or $Q^{13'}$ is cycloalkyl. In another embodiment, $Q^5$, $Q^{5'}$, $Q^6$, $Q^{6'}$, $Q^{12}$, $Q^{12'}$, $Q^{13}$ and/or $Q^{13'}$ is alkyl. In another embodiment, $Q^5$, $Q^{5'}$, $Q^6$, $Q^{6'}$, $Q^{12}$, $Q^{12'}$, $Q^{13}$ and/or $Q^{13'}$ is heterocycloalkyl. In another embodiment, $Q^5$, $Q^{5'}$, $Q^6$, $Q^{6'}$, $Q^{12}$, $Q^{12'}$, $Q^{13}$ and/or $Q^{13'}$ is aryl. In another embodiment, $Q^5$, $Q^{5'}$, $Q^6$, $Q^{6'}$, $Q^{12}$, $Q^{12'}$, $Q^{13}$ and/or $Q^{13'}$ is benzyl. In another embodiment, $Q^5$, $Q^{5'}$, $Q^6$, $Q^{6'}$, $Q^{12}$, $Q^{12'}$, $Q^{13}$ and/or $Q^{13'}$ is halide. In another embodiment, $Q^5$, $Q^{5'}$, $Q^6$, $Q^{6'}$, $Q^{12}$, $Q^{12'}$, $Q^{13}$ and/or $Q^{13'}$ is $N(Q)_2$. In another embodiment, $Q^5$, $Q^{5'}$, $Q^6$, $Q^{6'}$, $Q^{12}$, $Q^{12'}$, $Q^{13}$ and/or $Q^{13'}$ is $NO_2$. In another embodiment, $Q^5$, $Q^{5'}$, $Q^6$, $Q^{6'}$, $Q^{12}$, $Q^{12'}$, $Q^{13}$ and/or $Q^{13'}$ is COQ. In another embodiment, $Q^5$, $Q^{5'}$, $Q^6$, $Q^{6'}$, $Q^{12}$, $Q^{12'}$, $Q^{13}$ and/or $Q^{13'}$ is CN. In another embodiment, $Q^5$, $Q^{5'}$, $Q^6$, $Q^{6'}$, $Q^{12}$, $Q^{12'}$, $Q^{13}$ and/or $Q^{13'}$ is $CON(Q)_2$. In another embodiment, $Q^5$, $Q^{5'}$, $Q^6$, $Q^{6'}$, $Q^{12}$, $Q^{12'}$, $Q^{13}$ and/or $Q^{13'}$ is CO(N-heterocycle). In another embodiment, $Q^5$, $Q^{5'}$, $Q^6$, $Q^{6'}$, $Q^{12}$, $Q^{12'}$, $Q^{13}$ and/or $Q^{13'}$ is COOQ.

In one embodiment, $Q^9$ is H, alkyl, cycloalkyl, heterocycloalkyl, aryl, benzyl, halide, $N(Q)_2$, $NO_2$, COR, CN, $CON(Q)_2$, CO(N-Heterocycle) or COOQ. In another embodiment, $Q^9$ is H. In another embodiment, $Q^9$ is alkyl. In another embodiment, $Q^9$ is cycloalkyl. In another embodiment, $Q^9$ is alkyl. In another embodiment, $Q^9$ is heterocycloalkyl. In another embodiment, $Q^9$ is aryl. In another embodiment, $Q^9$ is benzyl. In another embodiment, $Q^9$ is halide. In another embodiment, $Q^9$ is $N(Q)_2$. In another embodiment, $Q^9$ is $NO_2$. In another embodiment, $Q^9$ is COQ. In another embodiment, $Q^9$ is CN. In another embodiment, $Q^9$, is $CON(Q)_2$. In another embodiment, $Q^9$ is CO(N-heterocycle). In another embodiment, $Q^9$ is COOQ.

In one embodiment, $Q^{9'}$ is H, alkyl, cycloalkyl, heterocycloalkyl, aryl, benzyl, halide, $N(Q)_2$, $NO_2$, COR, CN, $CON(Q)_2$, CO(N-heterocycle), COOQ or COOH. In another embodiment, $Q^{9'}$ is H. In another embodiment, $Q^{9'}$ is alkyl. In another embodiment, $Q^{9'}$ is cycloalkyl. In another embodiment, $Q^{9'}$ is alkyl. In another embodiment, $Q^{9'}$ is heterocycloalkyl. In another embodiment, $Q^{9'}$ is aryl. In another embodiment, $Q^{9'}$ is benzyl. In another embodiment, $Q^{9'}$ is halide. In another embodiment, $Q^{9'}$ is $N(Q)_2$. In another embodiment, $Q^{9'}$ is $NO_2$. In another embodiment, $Q^{9'}$ is COQ. In another embodiment, $Q^{9'}$ is CN. In another embodiment, $Q^{9'}$, is $CON(Q)_2$. In another embodiment, $Q^{9'}$ is CO(N-heterocycle). In another embodiment, $Q^{9'}$ is COOQ.

An "alkyl" group refers, in one embodiment, to a saturated aliphatic hydrocarbon, including straight-chain or branched-chain. In one embodiment, alkyl of formula I-V is linear or branched. In another embodiment, alkyl is optionally substituted linear or branched. In another embodiment, alkyl is methyl. In another embodiment alkyl is ethyl. In one embodiment, the alkyl group has 1-20 carbons. In another embodiment, the alkyl group has 1-8 carbons. In another embodiment, the alkyl group has 1-7 carbons. In another embodiment, the alkyl group has 1-6 carbons. In another embodiment, non-limiting examples of alkyl groups include methyl, ethyl, propyl, isobutyl, butyl, pentyl or hexyl. In another embodiment, the alkyl group has 1-4 carbons. In another embodiment, the alkyl group may be optionally substituted by one or more groups selected from halide, hydroxy, alkoxy, carboxylic acid, aldehyde, carbonyl, amido, cyano, nitro, amino, alkenyl, alkynyl, aryl, azide, epoxide, ester, acyl chloride and thiol.

A "cycloalkyl" group refers, in one embodiment, to a ring structure comprising carbon atoms as ring atoms, which are saturated, substituted or unsubstituted. In another embodiment the cycloalkyl is a 3-12 membered ring. In another embodiment the cycloalkyl is a 6 membered ring. In another embodiment the cycloalkyl is a 5-7 membered ring. In another embodiment the cycloalkyl is a 3-8 membered ring. In another embodiment, the cycloalkyl group may be unsubstituted or substituted by a halogen, alkyl, haloalkyl, hydroxyl, alkoxy, carbonyl, amido, alkylamido, dialkylamido, cyano, nitro, $CO_2H$, amino, alkylamino, dialkylamino, carboxyl, thio and/or thioalkyl. In another embodiment, the cycloalkyl ring may be fused to another saturated or unsaturated 3-8 membered ring. In another embodiment, the cycloalkyl ring is an unsaturated ring. Non limiting examples of a cycloalkyl group comprise cyclohexyl, cyclohexenyl, cyclopropyl, cyclopropenyl, cyclopentyl, cyclopentenyl, cyclobutyl, cyclobutenyl, cyclooctyl, cyclooctadienyl (COD), cyclooctaene (COE) etc.

A "heterocycloalkyl" group refers in one embodiment, to a ring structure of a cycloalkyl as described herein comprising in addition to carbon atoms, sulfur, oxygen, nitrogen or any combination thereof, as part of the ring. In one embodiment, non-limiting examples of heterocycloalkyl include pyrrolidine, pyrrole, tetrahydrofuran, furan, thiolane, thiophene, imidazole, pyrazole, pyrazolidine, oxazolidine, oxazole, isoxazole, thiazole, isothiazole, thiazolidine, dioxolane, dithiolane, triazole, furazan, oxadiazole, thiadiazole, dithiazole, tetrazole, piperidine, oxane, thiane, pyridine, pyran, thiopyran, piperazine, morpholine, thiomorpholine, dioxane, dithiane, diazine, oxazine, thiazine, dioxine, triazine, and trioxane.

As used herein, the term "aryl" refers to any aromatic ring that is directly bonded to another group and can be either substituted or unsubstituted. The aryl group can be a sole substituent, or the aryl group can be a component of a larger substituent, such as in an arylalkyl, arylamino, arylamido, etc. Exemplary aryl groups include, without limitation, phenyl, tolyl, xylyl, furanyl, naphthyl, pyridinyl, pyrimidinyl, pyridazinyl, pyrazinyl, triazinyl, thiazolyl, oxazolyl, isooxazolyl, pyrazolyl, imidazolyl, thiophene-yl, pyrrolyl, phenylmethyl, phenylethyl, phenylamino, phenylamido, etc. Substitutions include but are not limited to: F, Cl, Br, I, $C_1$-$C_5$ linear or branched alkyl, $C_1$-$C_5$ linear or branched haloalkyl, $C_1$-$C_5$ linear or branched alkoxy, $C_1$-$C_5$ linear or branched haloalkoxy, $CF_3$, CN, $NO_2$, —$CH_2CN$, $NH_2$, NH-alkyl, $N(alkyl)_2$, hydroxyl, —$OC(O)CF_3$, —$OCH_2Ph$, —NHCO-alkyl, COOH, —C(O)Ph, C(O)O-alkyl, C(O)H, or - or —$C(O)NH_2$.

N-heterocycle refers to in one embodiment, to a ring structure comprising in addition to carbon atoms, a nitrogen atom, as part of the ring. In another embodiment the N-heterocycle is a 3-12 membered ring. In another embodiment the N-heterocycle is a 6 membered ring. In another embodiment the N-heterocycle is a 5-7 membered ring. In another embodiment the N-heterocycle is a 3-8 membered ring. In another embodiment, the N-heterocycle group may be unsubstituted or substituted by a halogen, alkyl, haloalkyl, hydroxyl, alkoxy, carbonyl, amido, alkylamido, dialkylamido, cyano, nitro, $CO_2H$, amino, alkylamino, dialkylamino, carboxyl, thio and/or thioalkyl. In another embodiment, the heterocycle ring may be fused to another saturated or unsaturated cycloalkyl or heterocyclic 3-8 membered ring. In another embodiment, the N-heterocyclic ring is a saturated ring. In another embodiment, the N-heterocyclic ring is an unsaturated ring. Non limiting examples of N-heterocycle comprise pyridine, piperidine, morpholine, piperazine, pyrrolidine, pyrrole, imidazole, pyrazole, pyrazolidine, triazole, tetrazole, piperazine, diazine, or triazine.

In one embodiment, the term "halide" used herein refers to any substituent of the halogen group (group 17). In another embodiment, halide is flouride, chloride, bromide or iodide. In another embodiment, halide is fluoride. In another embodiment, halide is chloride. In another embodiment, halide is bromide. In another embodiment, halide is iodide.

In one embodiment, haloalkyl is partially halogenated. In another embodiment haloalkyl is perhalogenated (completely halogenated, no C—H bonds). In another embodiment, haloalkyl refers to alkyl, alkenyl, alkynyl or cycloalkyl substituted with one or more halide atoms. In another embodiment, haloalkyl is $CH_2CF_3$. In another embodiment, haloalkyl is $CH_2CCl_3$. In another embodiment, haloalkyl is $CH_2CF_3$. In another embodiment, haloalkyl is $CH_2Cl_3$. In another embodiment, haloalkyl is $CF_2CF_3$. In another embodiment, haloalkyl is $CH_2CH_2CF_3$. In another embodiment, haloalkyl is $CH_2CF_2CF_3$. In another embodiment, haloalkyl is $CF_2CF_2CF_3$.

In one embodiment, M of formula I-III and VI-X is a monovalent cation. In another embodiment, non-limiting examples of M include alkali metal cations, $NH_4^+$, $N(Q^3)_4^+$, and $P(Q^3)_4^+$. In another embodiment, M is $Li^+$. In another embodiment, M is $Na^+$. In another embodiment, M is $K^+$. In another embodiment, M is $Rb^+$. In another embodiment, M is $Cs^+$. In another embodiment, non-limiting examples of the quarternary ammonium cation, $N(Q^3)_4^+$, include tetrametylammonium, tetraethylammonium, tetrabutylammonium, tetraoctylammonium, trimethyloctylammonium and cetyltrimethylammonium. In another embodiment, non-limiting examples of the quarternary phosphonium cation, $P(Q^3)_4^+$, include tetraphenylphosphonium, dimethyldiphenylphosphonium, tetrabutylphosphonium, methyltriphenoxyphosphonium and tetramethylphosphonium.

In one embodiment, this invention is directed to a photoluminescent compound represented by the structure of formula 1, 2, 3, 4, 5, 6, 7, 8, 9, 10, 11, 9A, 10a or 11a.

25 26
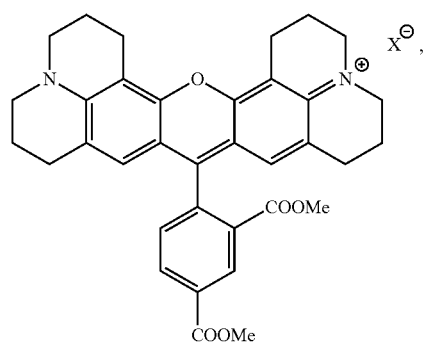
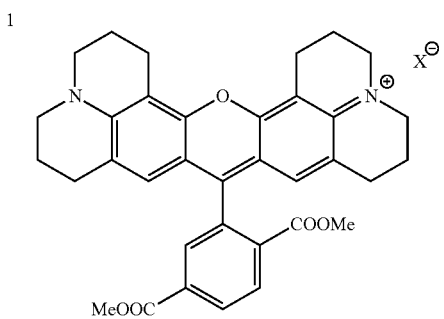
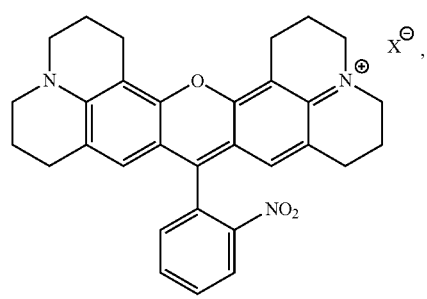
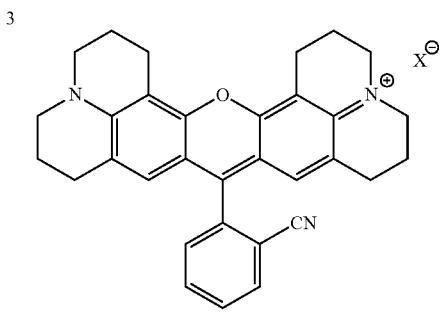
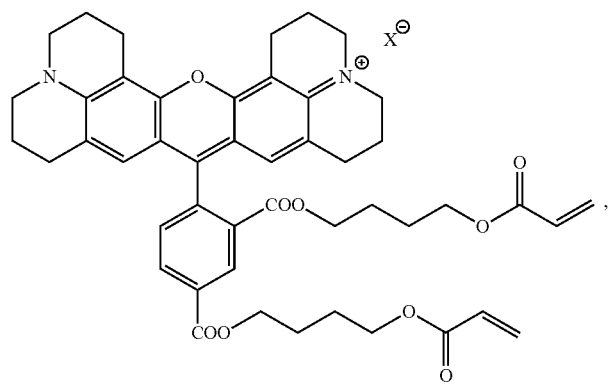
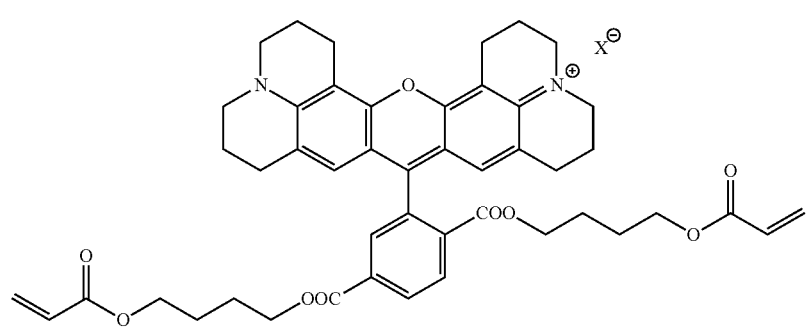

-continued
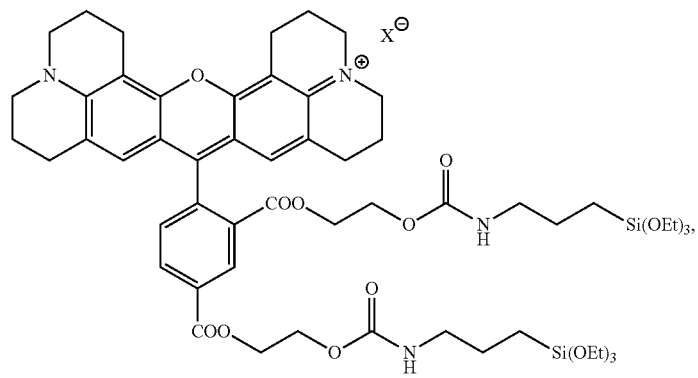
7
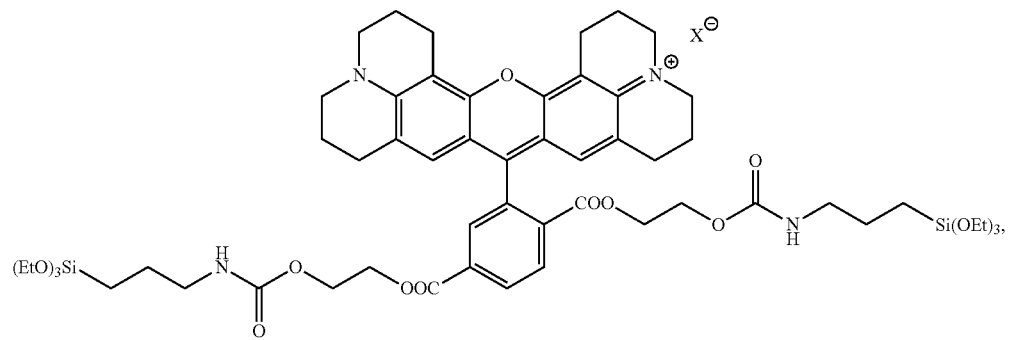
8
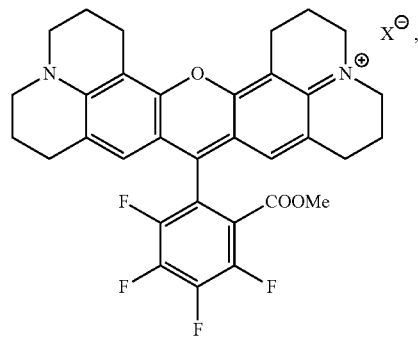
9
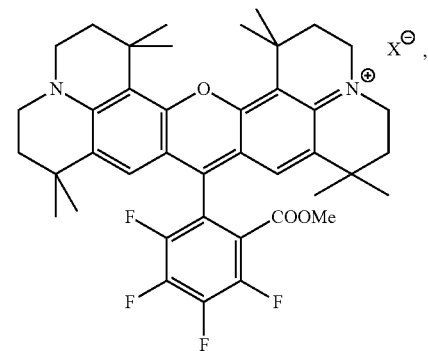
10
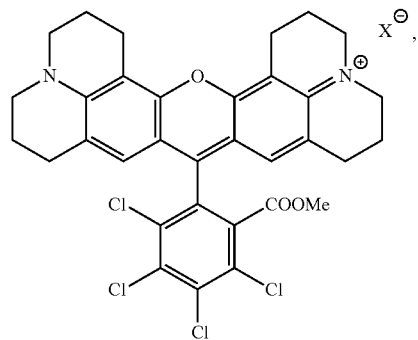
11
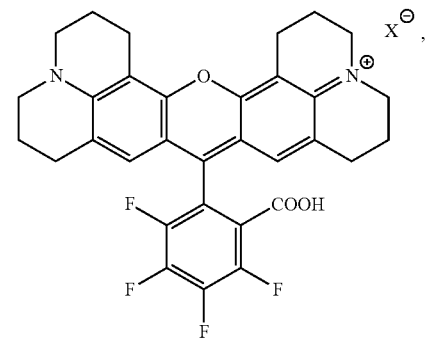
9a

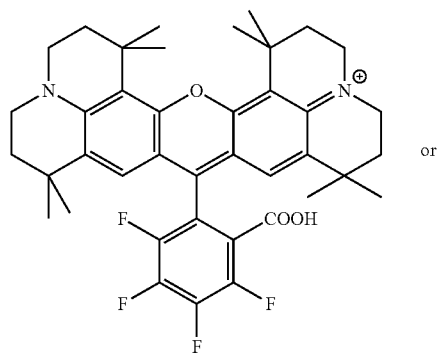

10a

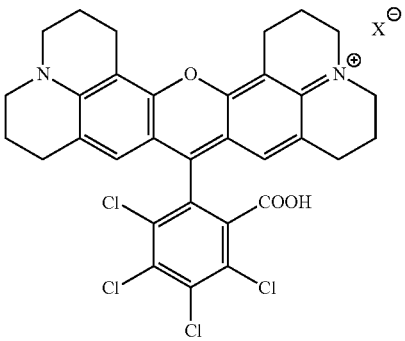

11a or

In one embodiment, X of compounds of formula I-X and 1-11, 9a, 10a, 11a is an anion. In one embodiment, the anion is a monovalent. In one embodiment, the anion is a divalent. In another embodiment the anion is a, sulfate, chloride, bromide, iodide, perchlorate, nitrate, trifluoroacetate, hydroxide, hydrosulfide, sulfide, nitrite, carboxylate, dicarboxylate, sulfonate, tetraflouroborate hexaflourophosphate, hypophosphite, phosphate, phosphite, cyanate, cyanide, isocyanate, thiocyanate, tetralkylborates, tetraarylborates or chromate. In another embodiment, non-limiting groups of carboxylate include formate, propionate, butyrate, lactate, pyruvate, tartrate, ascorbate, gluconate, glutamate, citrate, succinate, maleate, 4-pyridinecarboxylate, 2-hydroxypropanoate and glucoronate. In another embodiment, non-limiting groups of sulfonate include mesylate, tosylate, ethanesulfonate, benzenesulfonate, and triflate. In another embodiment, non-limiting groups of tetraalkylborates include tetramethylborate, trimethylethylborate and triethylbutylborate. In another embodiment, non-limiting groups of tetraaryylborates include tetrakis[3,5-bis(trifluoromethyl) phenyl]borate, tetrakis(4-chlorophenyl)borate, tetrakis(pentafluorophenyl)borate and tetrakis(4-fluorophenyl)borate.

Figure 2:
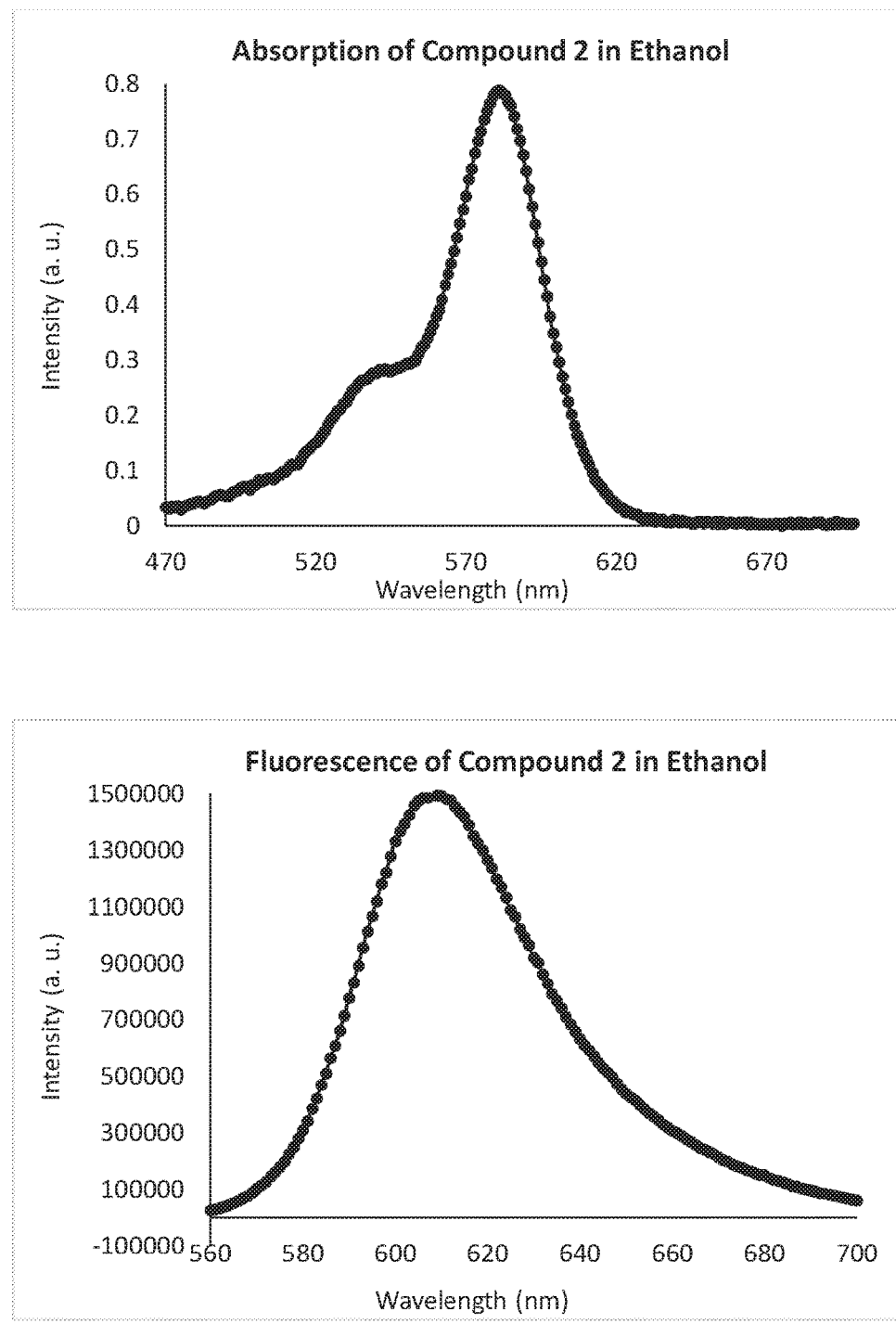
FIG. 2 depicts absorption and emission spectra of a compound 2 in ethanol, wherein the compound absorbs at 581 nm and emits at 608 nm
Figure 3:
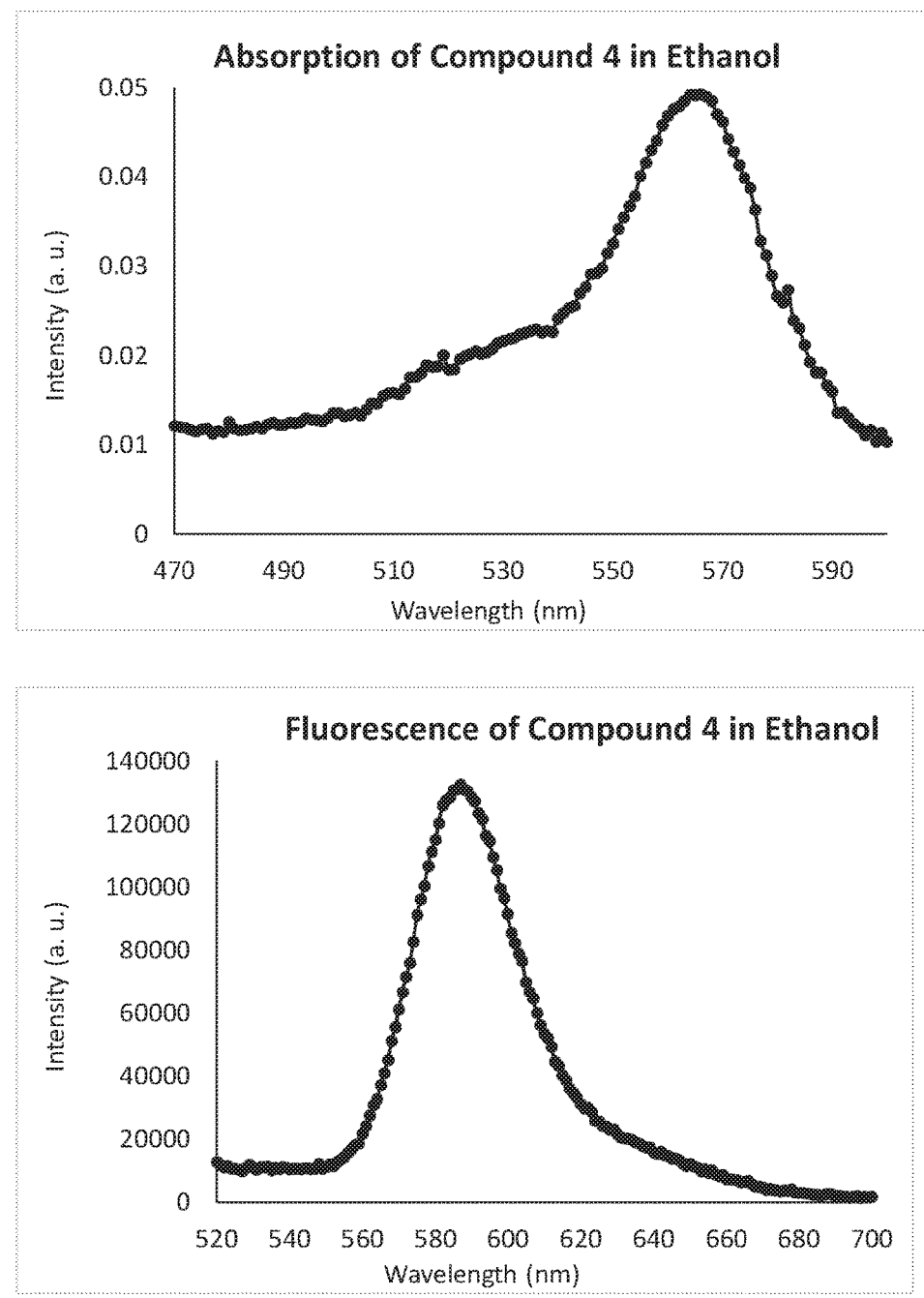
FIG. 3 depicts absorption and emission spectra of a compound 4 in ethanol, wherein the compound absorbs at 564 nm and emits at 587 nm.
Figure 4:
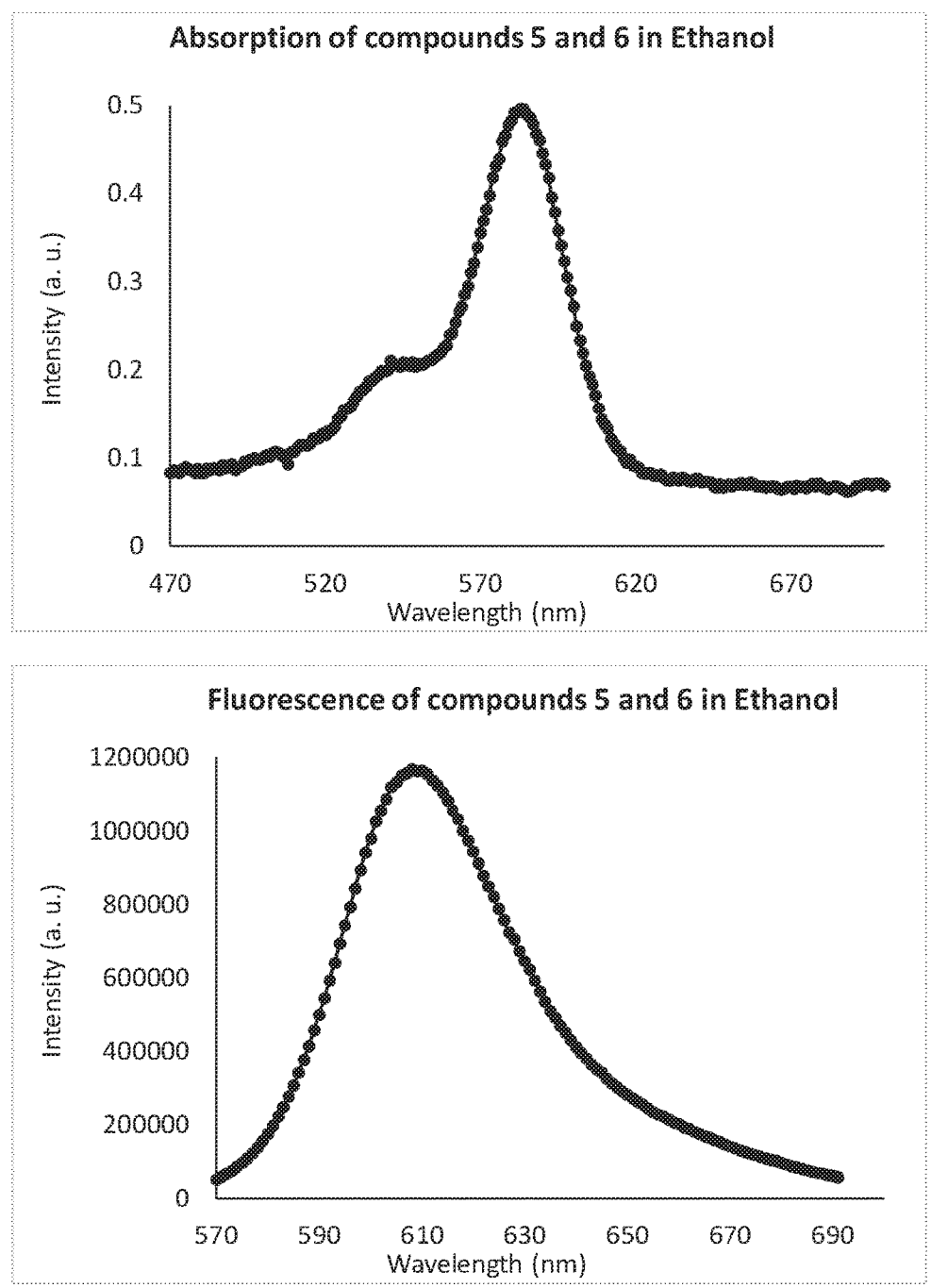
FIG. 4 depicts absorption and emission spectra of a mixture of compounds 5 and 6 in ethanol, wherein the mixture absorbs at 583 nm and emits at 608 nm.
Figure 5:
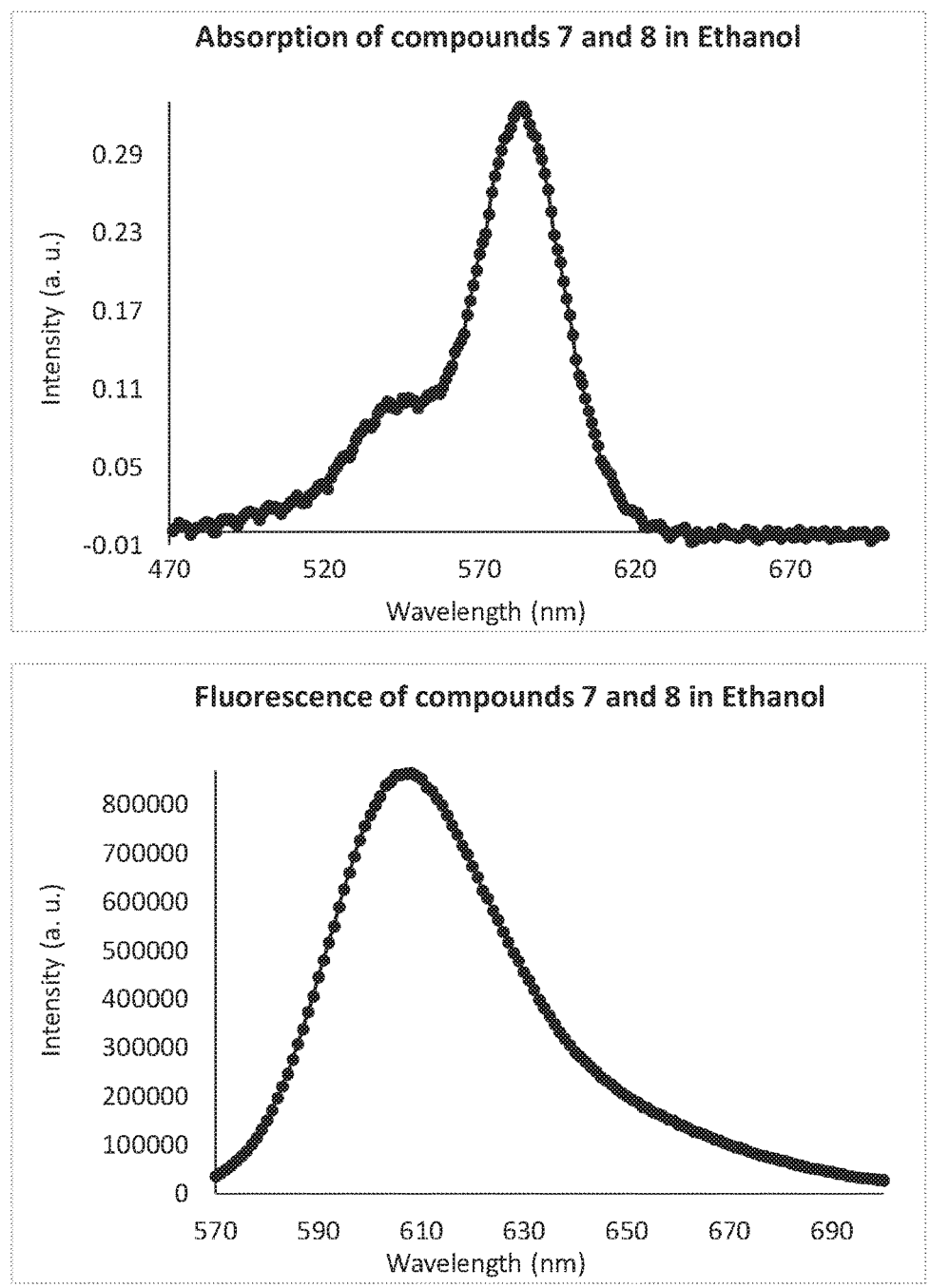
FIG. 5 depicts absorption and emission spectra of a mixture of compounds 7 and 8 in ethanol, wherein the mixture absorbs at 583 nm and emits at 608 nm.
Figure 6:
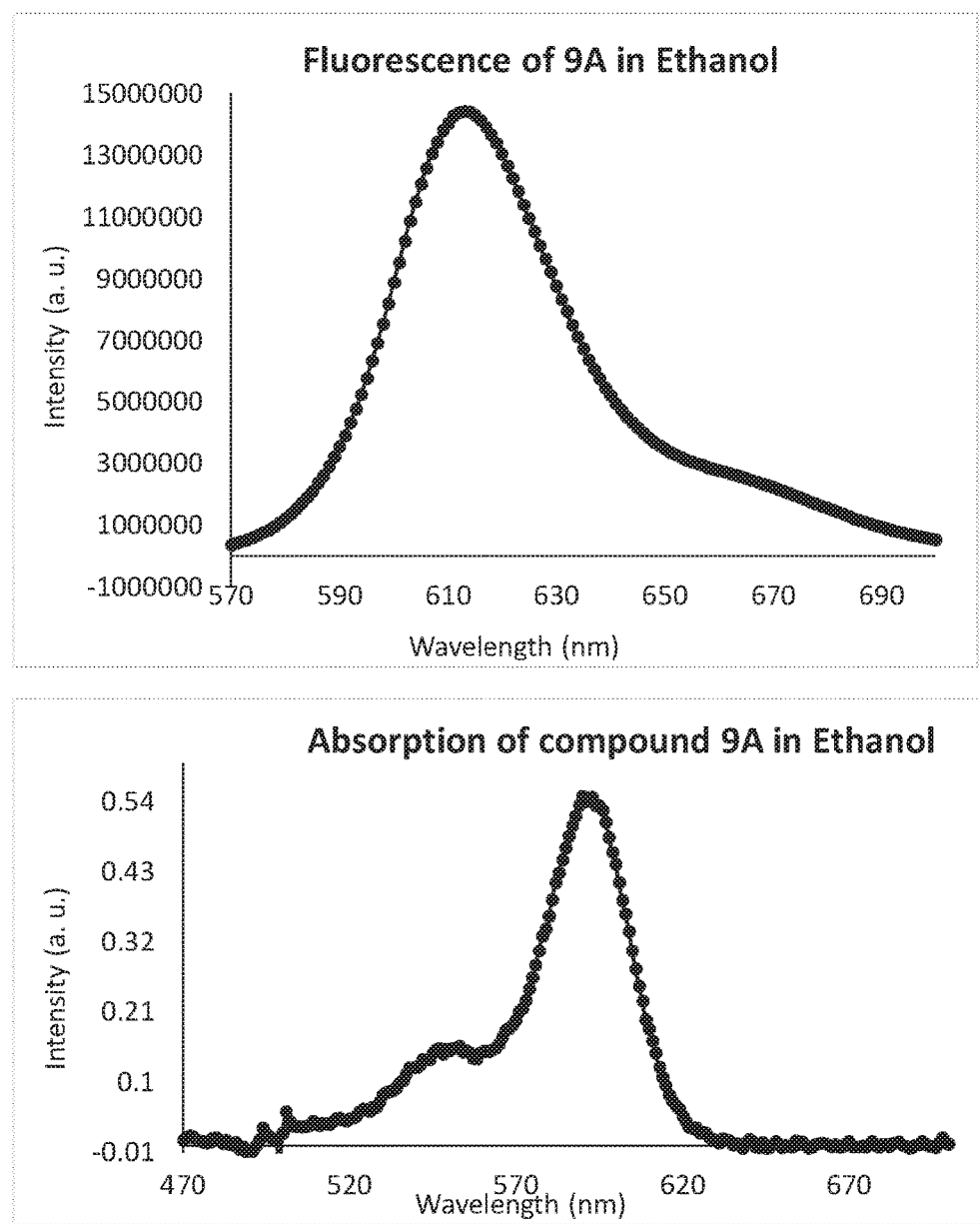
FIG. 6 depicts absorption and emission spectra of compound 9A in ethanol, wherein the compound absorbs at 590 nm and emits at 613 nm.
Figure 7:
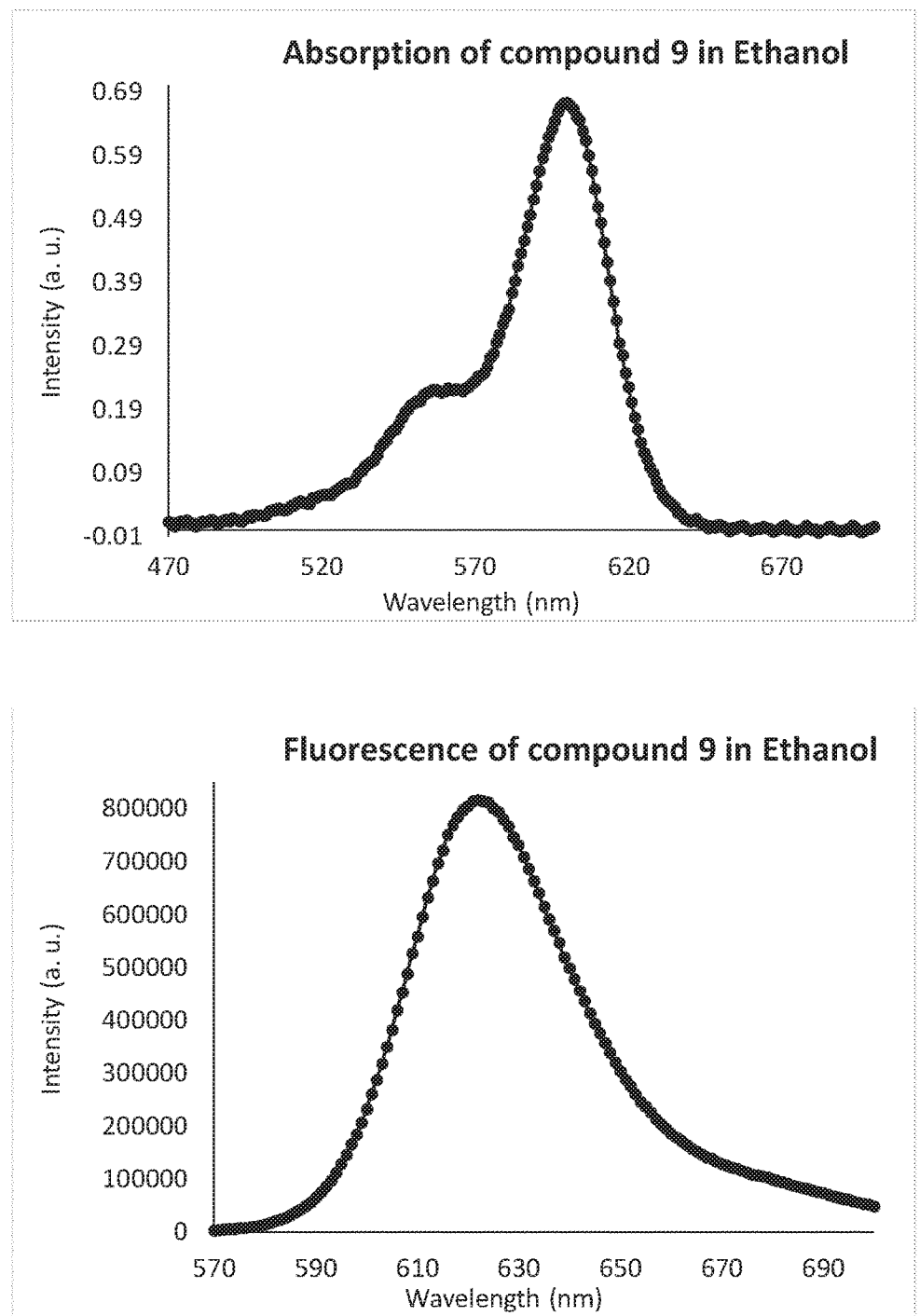
FIG. 7 depicts absorption and emission spectra of compound 9 in ethanol, wherein the compound absorbs at 600 nm and emits at 622 nm.
Figure 8:
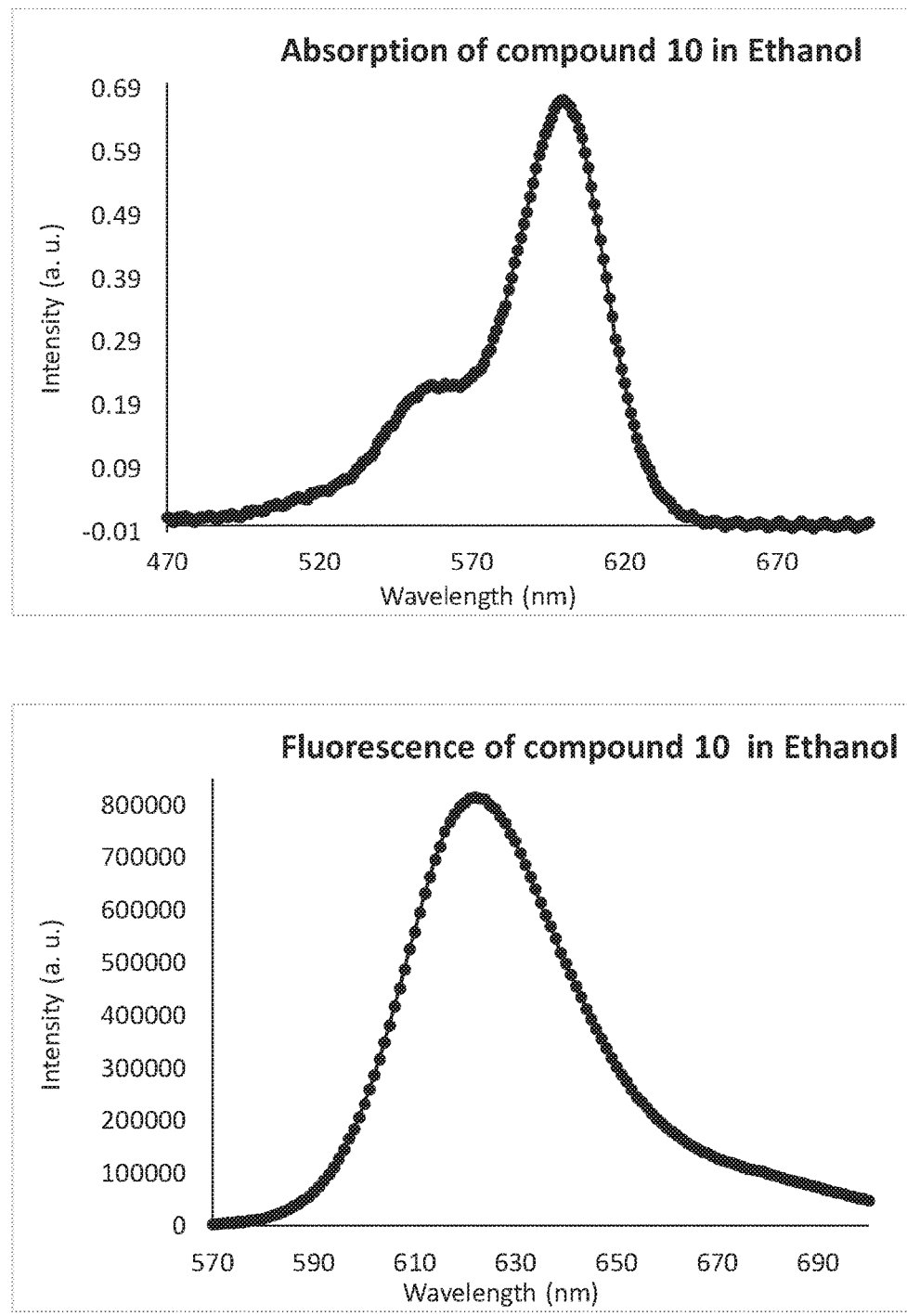
FIG. 8 depicts absorption and emission spectra of compound 10 in ethanol, wherein the compound absorbs at 604 nm and emits at 621 nm.
Figure 9:
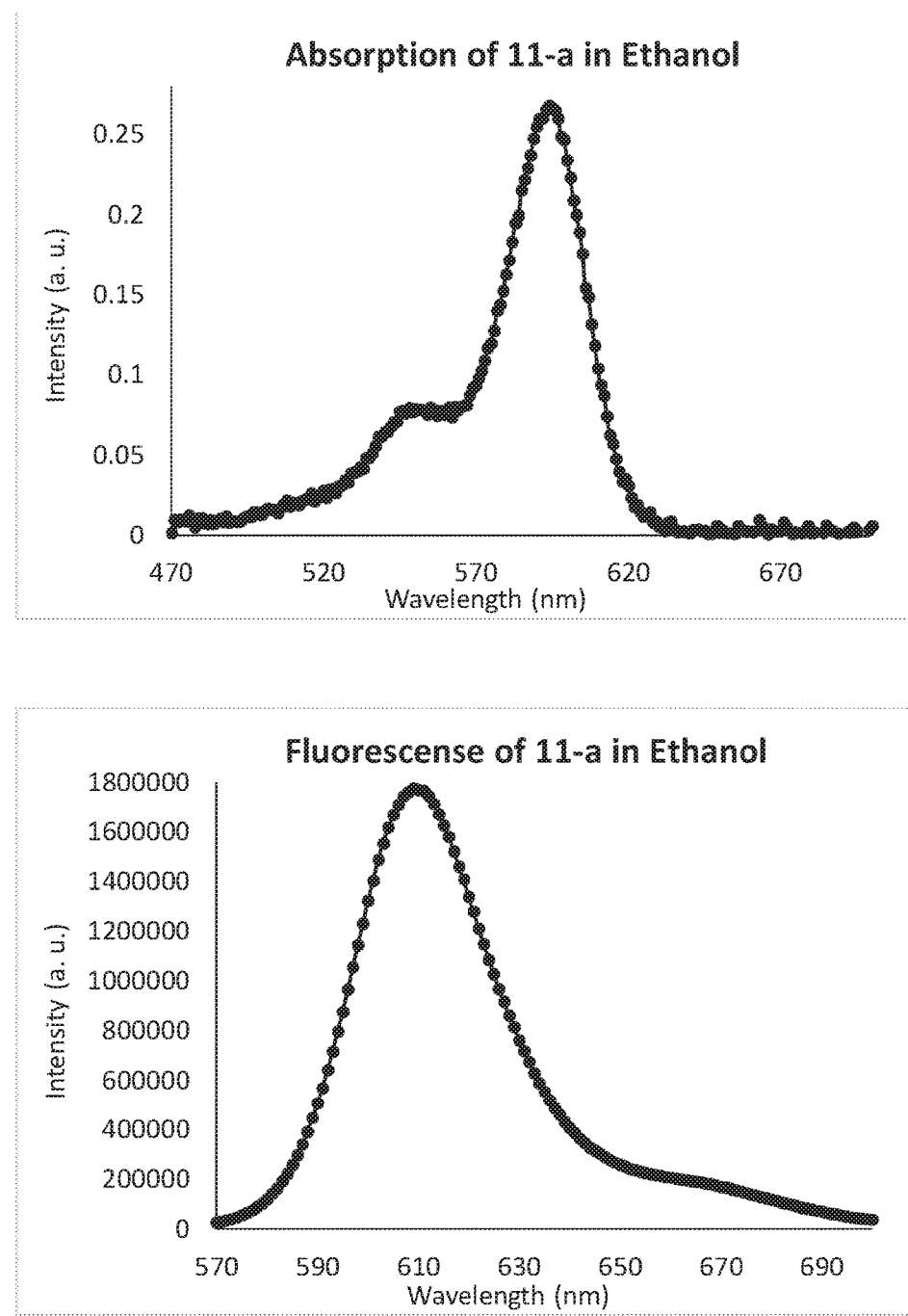
FIG. 9 depicts absorption and emission spectra of compound 11-a in ethanol, wherein the compound absorbs at 594 nm and emits at 609 nm.
Figure 10:
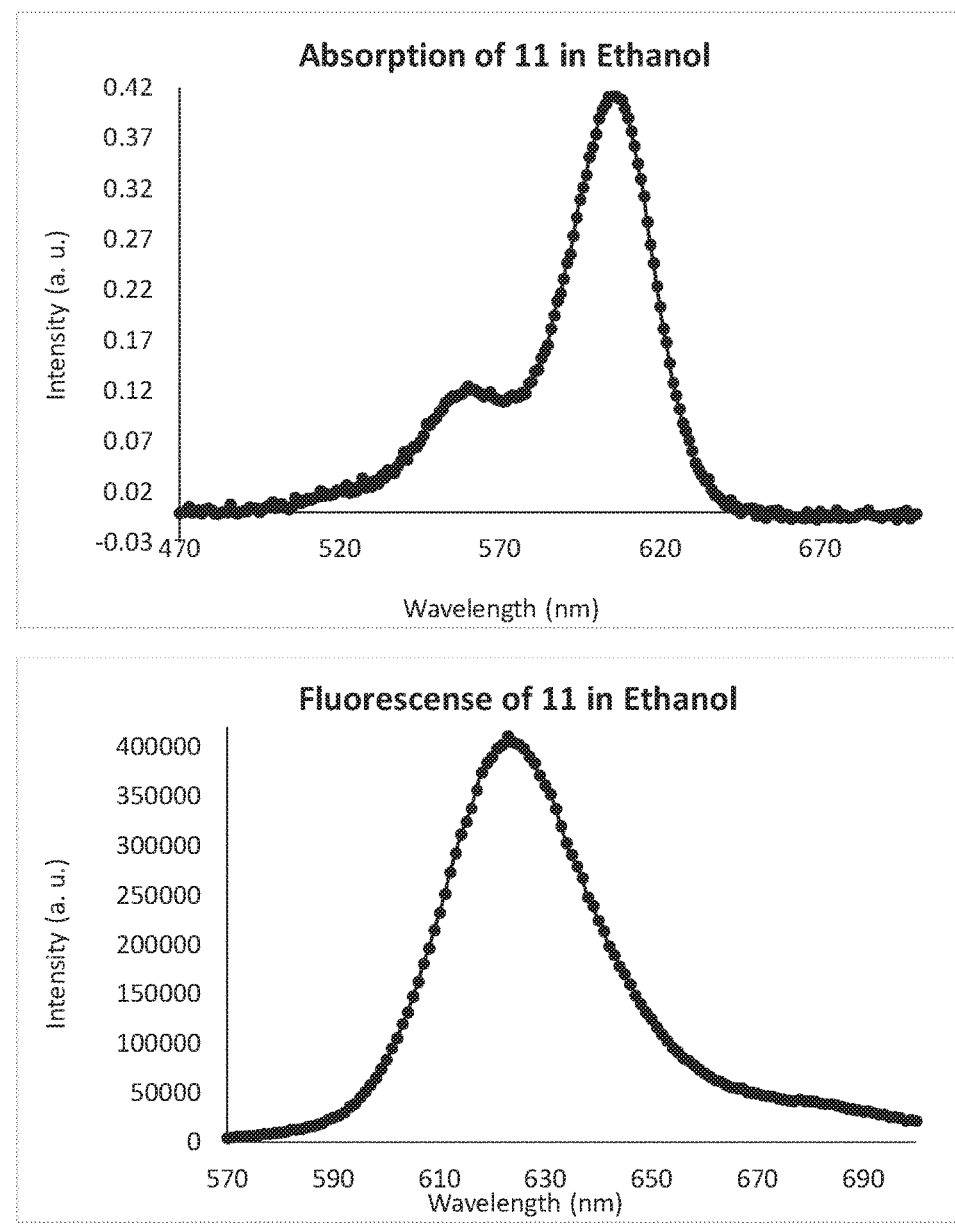
FIG. 10 depicts absorption and emission spectra of compound 11 in ethanol, wherein the compound absorbs at 606 nm and emits at 623 nm.

In one embodiment, the esterified phenyl with or without additional electron withdrawing groups of the compounds of this invention possess improved photoluminescent properties in solution with an unexpected red shift compared to the corresponding COOH groups as presented in FIGS. 1-7 and in Examples 1-8. In another embodiment, the esterified phenyl with additional electron withdrawing groups possess improved photoluminescent properties in solution with an unexpected red shift compared to the corresponding COOH groups and compared to the corresponding compound with no electron withdrawing substituents. In another embodiment, substituted phenyl with electron withdrawing groups possess improved photoluminescent properties in solution with an unexpected red shift compared to the corresponding unsubstituted phenyl compound.

In another embodiment, the photoluminescent compounds of this invention emit in ethanol solution at a wavelength of between 585 nm to 625 nm. In another embodiment, the photoluminescent material of compound of formula 1 emits at 606 nm in ethanol. In another embodiment, the photoluminescent material of compound of formula 2 emits at 608 nm in ethanol. In another embodiment, the photoluminescent material of a mixture of compound of formula 1 and 2 emits at 606 nm in ethanol. In another embodiment, the photoluminescent material of a compound of formula 3 emits at 585 nm in ethanol. In another embodiment, the photoluminescent material of a compound of formula 4 emits at 587 nm in ethanol. In another embodiment, the photoluminescent material of a mixture of compound of formula 5 and 6 emits at 608 nm in ethanol. In another embodiment, the photoluminescent material of a mixture of compound of formula 7 and 8 emits at 608 nm in ethanol. In another embodiment, the photoluminescent material of compound of formula 10 emits at 622 nm in ethanol.

OLEDs (organic light emitting diodes) have attracted much attention for application to next-generation displays. During the past decade, several commercial products have been developed using small OLEDs fabricated by vacuum evaporation. However, current OLED technologies still have limited color gamut. Therefore, it is required to continue developing alternative technologies, such as LCDs with the proposed innovation.

In Liquid Crystal Displays (LCDs) the image is created by combining three basic colors—red, green and blue at different ratios. Each ratio combination provides one color out of all possible colors of the display, which altogether define the Color Gamut of the display. There are three main components responsible for controlling the color production—the backlight unit which generates the basic color (White), the LCD which is a matrix of pixels each controlling the amount of color passing through, and the color filters that filter out each sub-pixel to leave only its required color (Red, Green or Blue). two parameters that impacts the Color Gamut coverage are (1) the color spectra peak wavelength and (2) FWHM for each color wavelengths. As the blue, green and red peaks are near ~450, ~530 and above 620 nm up to 700 nm, respectively and also that each peak has a narrower FWHM results in obtaining a larger the Color Gamut, or in other words more colors can be produced.

To increase the color gamut of a display, with respect to the maximum human eye color saturation, the light source needs to have narrow bands (FWHM) at the corresponding blue, green and red color wavelengths mentioned above (~450, ~530 and above 620 nm up to 700 nm). A downside of the narrow bandwidth (for example by color filtering) can be reduction in the image intensity.

Another solution could have been using three different LEDs each emitting at the red, green and blue, respectively. However the cost and complexity of this solution made this option less cost effective for most applications.

White-light emitting diodes based on blue inorganic emitters (InGaN based) coated with phosphor materials are regularly used. The semiconductor device converts its original blue radiation into a yellow-green light (by the phosphor based compound) that, combined with the remaining blue light from the irradiation source, yields an overall white-yellowish emission. This white-yellowish emission from such device does not yield a good quality white emission, since besides the good blue emission from the InGa LED, the remaining yellowish emission has a broad FWHM (Full Width at Half Maximum), resulting in smaller color gamut. Alternative fluorescent inorganic compounds used are quantum dots but they do not offer either the efficiency, durability, or cost effective demanded by the display devices. Moreover, quantum dots are based mostly on toxic cadmium compounds while there is a worldwide legislation ((US EPA TSCA—Toxic Substances Control Act) and European Regulation of hazardous Substances (RoHS)) soon to become effective that forbids the use of such materials.

In order to circumvent the lighting quality, brightness and the color rendering issues, organic fluorescent dyes have been developed, which give access to both a large number of available molecules and to the possibility of easily tuning their emission spectra by molecular engineering. Fluorescent molecular dyes such as perylene and naphthalene based derivatives, for instance, have been synthesized as highly efficient and highly stable fluorescent molecules. Despite their promising emission properties, such organic dyes often suffer from a lack of the required long-term thermal and chemical photo-stability when submitted to the severe physical-chemical conditions encountered in most lighting devices. In order to increase the photostability, modified fluorophores have been developed by combining the photoluminescent (PL) compounds in solid matrices. Such solid matrices can be produced in either (1) film form above the direct Backlight Unit (BLU) or waveguide, (2) glass/plastic tubes in close proximity to the LEDs in the BLU. Moreover, the embedment can further enhance the PL properties, such as narrower FWHM and enabling polarized emission. Examples of solid matrices include: epoxies, poly-acrylates, silicon resins, polyethylene glycols based polymers, liquid crystals, modified glass based on sol-gel methodology, or combination thereof (such as mixing sol-gel matrix and all is encapsulated in an additional epoxy matrix).

In one embodiment, this invention is directed to produce color-conversion-layer that is integrated in a display device, and more particularly, to a photoluminescent LCD comprising a compound of formula I-X. In another embodiment, this invention provides a photoluminescent device comprising a color-conversion-layer comprising a photoluminescent compound of formula I, II, III, IV, V, VI, VII, VIII, IX, X or any combination thereof. In another embodiment, the LCD comprises a compound of formula 1. In another embodiment, the LCD comprises a compound of formula 2. In another embodiment, the LCD comprises a mixture of compound of formula 1 and a compound of formula 2. In another embodiment, the LCD comprises a compound of formula 3. In another embodiment, the LCD comprises a compound of formula 4. In another embodiment, the LCD comprises a compound of formula 5. In another embodiment, the LCD comprises a compound of formula 6. In another embodiment, the LCD comprises a mixture of a compound of formula 5 and a compound of formula 6. In another embodiment, the LCD comprises a compound of formula 7. In another embodiment, the LCD comprises a compound of formula 8. In another embodiment, the LCD comprises a mixture of a compound of formula 7 and a compound of formula 8. In another embodiment, the LCD comprises a compound of formula 9. In another embodiment, the LCD comprises a compound of formula 10. In another embodiment, the LCD comprises a compound of formula 11. In another embodiment, the LCD comprises a compound of formula 9a. In another embodiment, the LCD comprises a compound of formula 10a. In another embodiment, the LCD comprises a compound of formula 11a. In another embodiment, the compound is a compound of formula 1-11, 9a, 10a, 11a or any combination thereof.

In one embodiment, the photoluminescent LCD comprises a display panel that displays red, green and blue sub-pixel areas, an excitation source operable to generate excitation radiation for operating the display and a color-elements plate. The color-elements plate comprises a film comprising at least one photoluminescent compound of this invention that is operable to emit a light corresponding to red, green or blue pixel areas of the display, in response to said excitation radiation. In another embodiment, the photoluminescent compounds of this invention emit light between 585 nm to 645 nm and are embedded in a solid matrix film in the LCD, yielding higher brightness and color gamut compared to typical white LED based device solutions.

In one embodiment, the photoluminescent LCD comprises: a display panel comprising light transmissive front and back plates; an excitation source operable to generate excitation radiation for operating the display; a liquid crystal disposed between the front and back plates; a matrix of electrodes defining red, green and blue pixel areas of the display and operable to selectively induce an electric field across the liquid crystal in the pixel areas for controlling transmission of light through the pixels areas; and a photoluminescence color-elements plate, wherein the color-element plate comprises at least one of the photoluminescent compounds of this invention. In another embodiment, the compound is a compound of formula I-X or any combination thereof. In another embodiment, the compound is a compound of formula 1. In another embodiment, compound is a compound of formula 2. In another embodiment, the compound is a mixture of a compound of formula 1 and a compound of formula 2. In another embodiment, the compound is a compound of formula 3. In another embodiment, the compound is a compound of formula 4. In another embodiment, the compound is a compound of formula 5. In another embodiment, the compound is a compound of formula 6. In another embodiment, the compound is a mixture of a compound of formula 5 and a compound of formula 6. In another embodiment, the compound is a compound of formula 7. In another embodiment, the compound is a compound of formula 8. In another embodiment, the compound is a mixture of a compound of formula 7 and a compound of formula 8. In another embodiment, the compound is a compound of formula 9. In another embodiment, the LCD comprises a compound of formula 10. In another embodiment, the LCD comprises a compound of formula 11. In another embodiment, the LCD comprises a compound of formula 9a. In another embodiment, the LCD comprises a compound of formula 10a. In another embodiment, the LCD comprises a compound of formula 11a. In another embodiment, the compound is a compound of formula 1-11, 9a, 10a, 11a or any combination thereof.

In yet another aspect the invention provides a liquid crystal display wherein the compound of this invention is embedded in a solid matrix. Non limiting examples of solid matrices include: epoxies, poly-acrylates, silicon resins, polyethylene glycols based polymers, liquid crystals, modified glass based on sol-gel methodology, or combination thereof.

In one embodiment, this invention provides a photoluminescent device comprising: a transparent, semi-transparent or diffusing substrate encapsulating or coated with a photoluminescent compound of this invention. In another embodiment, the photoluminescent device is integrated in a backlight unit of a LCD display.

In some embodiments, the compounds of the invention are used as bio-markers, medical markers, in photovoltaic cells, in solar cells, sensors, as electroluminescent materials, as laser dyes, theranostics, molecular probes for scientific research, ink for printing, exterior lighting applications, signage, cosmetics, or as dyes. In another embodiment, the compounds are used as dyes wherein the dyes are applied in glow sticks ("stick-lights").

The following examples are presented in order to more fully illustrate the preferred embodiments of the invention. They should in no way, however, be construed as limiting the broad scope of the invention.

EXAMPLES

Example 1

Synthesis of Compounds 1 and 2

Step 1

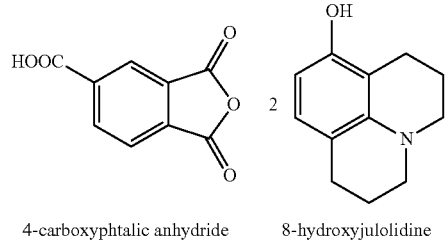

4-carboxyphtalic anhydride    8-hydroxyjulolidine

This process is based on L. J. Marnett et al. (Org. Lett. 2008, 10, 4799-4801). 8-hydroxyjulolidine (3.0 gr, 15.8 mmol), 4-carboxyphthalic anhydride (1.52 gr, 7.9 mmol) and p-toluene sulfonic acid monohydrate (PTSA) (0.06 gr, 0.3 mmol) were dissolved in propionic acid (126 ml) under nitrogen atmosphere. The reaction was heated to reflux overnight. After cooling to room temperature, the solvent was removed under reduced pressure. The crude product, was further purified using flash chromatography (CHCl$_3$:MeOH 3:1). The product, (a mixture of 1A and 2A) was obtained as a dark purple solid (yield 65%).

UV-Vis absorption: 568 nm (in EtOH)
Fluorescence emission: 591 nm (in EtOH)
FWHM=40 nm In order to isolate 1A and 2A, their mixture is further purified using flash chromatography. The 2A isomer was isolated with chloroform/methanol gradients (using CHCl$_3$:MeOH gradients of 5:1; then 4:1 and 3:1). After 2A was isolated, the gradient was elevated to CHCl$_3$:MeOH 1:1 to isolate the 1A compound.

Step 2

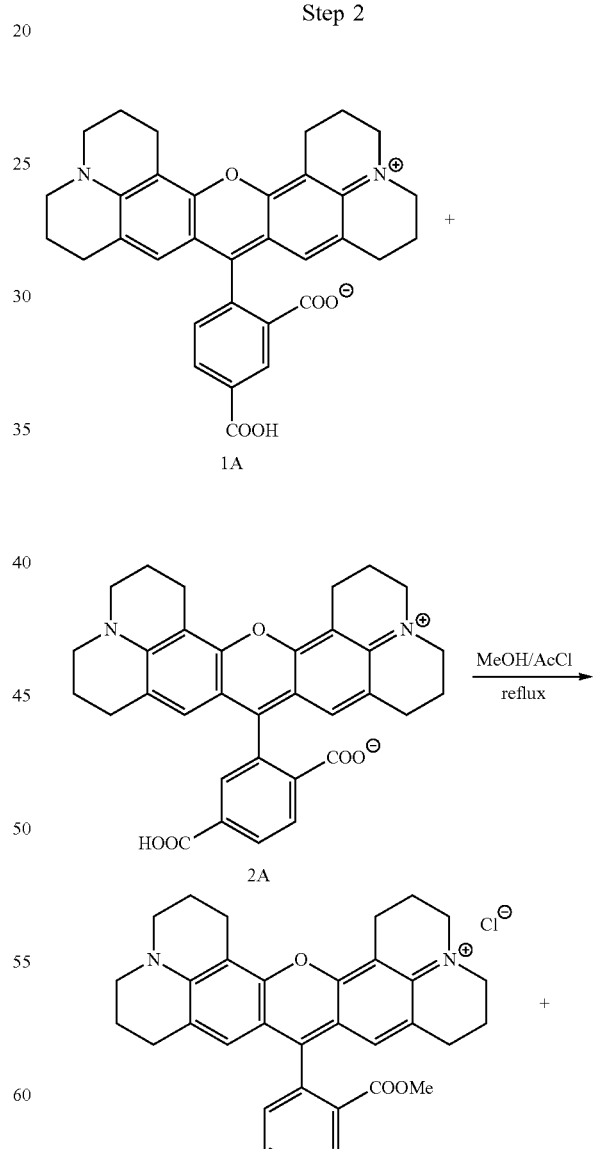

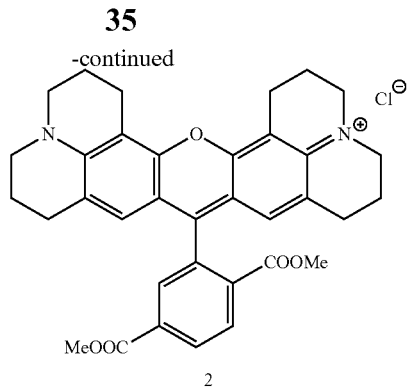

2

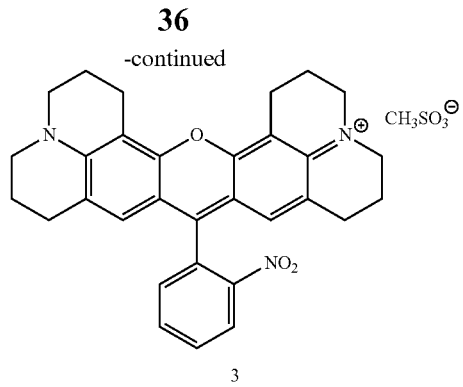

3

This process is based on J. A. Ross et al. (Synth. Commun. 2006, 36, 1745-1750).

The 6-carboxy-X rhodamine (1A) isomer (0.075 gr., 0.14 mmol) was dissolved in dry methanol (15 ml) under nitrogen atmosphere. Then acetyl chloride (1.3 ml, 18.2 mmol) was added dropwise at room temperature, and the reaction was heated to reflux for 2 days. Additional portion of acetyl chloride (0.75 ml, 10.5 mmol) was added and the reaction was heated for another day. The desirable product (1) was obtained by cooling the reaction to room temperature and removal of the solvent under reduced pressure (quantitative yield).

$^1$H NMR (400 MHz, DMSO-d6): δ 8.35-8.31 [m, 2H], 7.85 [d, J=1.6 Hz, 1H], 6.53 [s, 2H], 3.89 [s, 3H], 3.61 [s, 3H], 3.51 [t, J=5.6 Hz, 4H], 3.46 [t, J=5.6 Hz, 4H], 3.00-2.97 [m, 4H], 2.60 [t, J=5.6 Hz, 4H], 2.02-1.96 [m, 4H], 1.84-1.80 [m, 4H].

Calculated Mass: 563.4, [M-H]$^-$ 563.4.

UV-Vis absorption of is: 579 nm (in ethanol)

Fluorescence emission: 605 nm (in ethanol).

The 5-carboxy-X-rhodamine (2A) isomer (0.136 gr., 0.25 mmol) was dissolved in dry methanol (30 ml) under nitrogen atmosphere. Then acetyl chloride (2.35 ml, 33 mmol) was added dropwise at room temperature, and the reaction was heated to reflux for 2 days. Additional portion of acetyl chloride (1.5 ml, 21 mmol) was added and the reaction was heated for another day. The desirable product (2) was obtained by cooling the reaction to room temperature and removal of the solvent under reduced pressure (quantitative yield).

$^1$H NMR (400 MHz, DMSO-d6): δ 8.71 [d, J=2.0 Hz, 1H], 8.36 [dd, J=8.0 Hz, J=2.0 Hz, 1H], 7.54 [d, J=8.0 Hz, 1H], 6.54 [s, 2H], 3.96 [s, 3H], 3.62 [s, 3H], 3.51 [t, J=4.8 Hz, 4H], 3.46 [t, J=5.6 Hz, 4H] 3.00-2.96 [m, 4H], 2.60 [t, J=5.8 Hz, 4H], 2.02-1.97 [m, 4H], 1.84-1.79 [m, 4H].

Calculated Mass: 563.4, [M-H]– 563.4

UV-Vis absorption: 579 nm (in ethanol)

Fluorescence emission: 608 nm (in ethanol)

FWHM=45 nm

Example 2

Synthesis of Compound 3

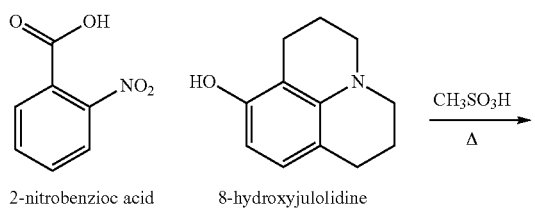

To a stirred solution of 8-hydroxyjulolidine (0.91 gr., 4.8 mmol) in methansulfonic acid (2 ml), 2-nitrobenzoic acid (0.4 gr., 2.4 mmol), was added. The reaction mixture was heated to 180° C. for 2 days. The solution was then cooled to room temperature, diluted with chloroform and washed with water. The chloroform was removed under reduced pressure to obtain the crude product. The product has a fluorescence peak at 585 nm, FWHM ~40 nm.

Example 3

Synthesis of Compound 4

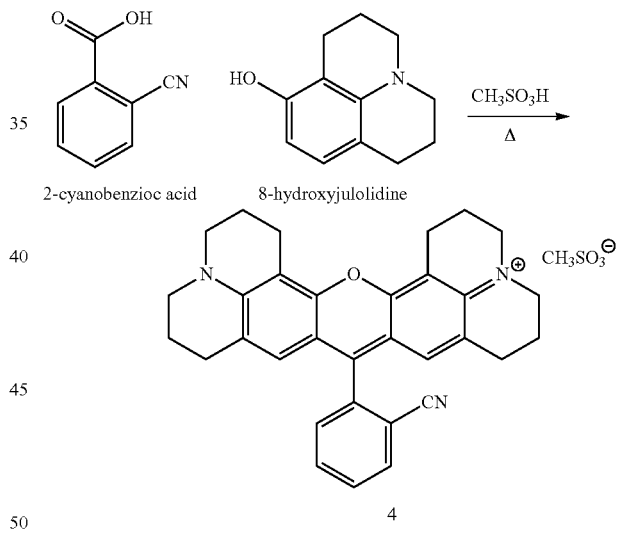

To a stirred solution of 8-hydroxyjulolidine (0.51 gr., 2.8 mmol) in methansulfonic acid (3 ml), 2-cyanobenzoic acid (0.2 gr., 1.4 mmol), was added. The reaction mixture was heated to 140° C. overnight. The solution was then cooled to room temperature, diluted with chloroform, washed with water and concentrated under reduced pressure. Purification by flash chromatography (SiO$_2$, MeOH:CHCl$_3$ 1:11) to yield compound 4 as a dark purple solid (0.124 g, 19%).

$^1$H NMR (400 MHz, DMSO-d6): δ 7.94 [d, J=7.5 Hz, 1H], 7.73-7.63 [m, 2H], 7.19 [d, J=7.6 Hz, 1H], 6.04 [s, 2H], 3.18 [t, J=5.3 Hz, 4H], 3.13 [t, J=5.5 Hz, 4H], 2.82 [t, J=6.4 Hz, 4H], 1.97-1.90 [m, 8H], 1.79-1.73 [m, 4H].

UV-Vis absorption of Compound 4 is: 564 nm (in ethanol)

Fluorescence emission: 587 nm (in ethanol)

FWHM=36 nm

Example 4

Synthesis of Compounds 5 and 6

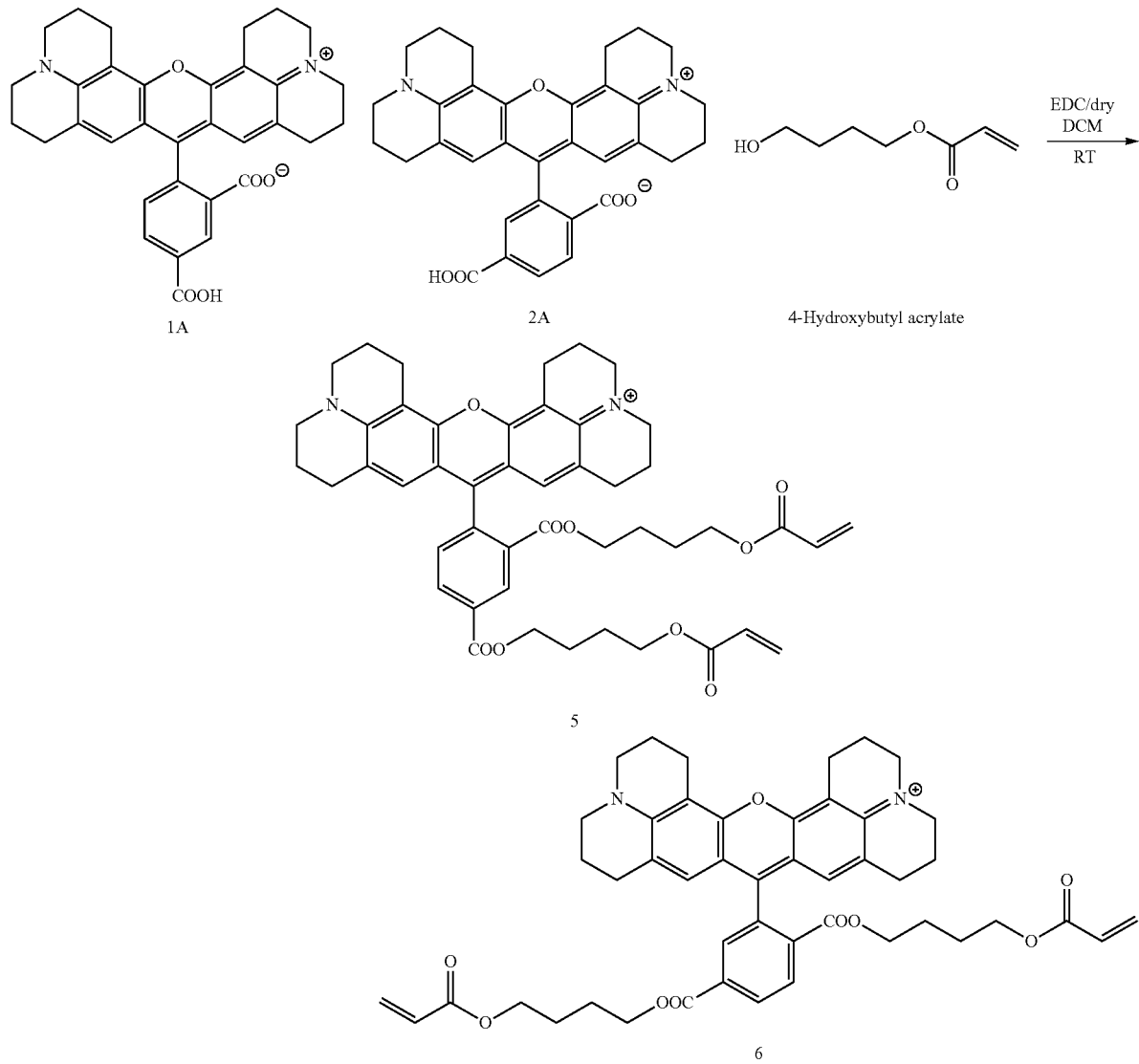

A mixture of 1A and 2A (0.4 gr, 0.75 mmol), 4-hydroxybutyl acrylate (0.23 ml, 1.60 mmol), 1-(3-dimethylaminopropyl)-3-ethylcarbodiimide hydrochloride (0.32 gr, 1.60 mmol) and 4-(dimethylamino)pyridine (0.04 gr, 0.3 mmol) were dissolved in dichloromethane (4.0 ml) under nitrogen atmosphere at room temperature for 24 hours. After reaction completion, the solvent was removed under reduced pressure to obtain the crude product which was further purified by column chromatography (CHCl$_3$:MeOH 7:1). The product, (a mixture of 5 and 6) was obtained as dark purple solid (yield 38%).

UV-Vis absorption: 583 nm (in EtOH)
Fluorescence emission: 608 nm (in EtOH)
FWHM=40 nm.

Example 7

Synthesis of Compounds 7 and 8

Step I

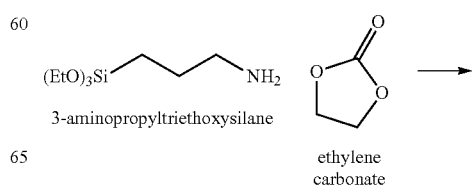

-continued

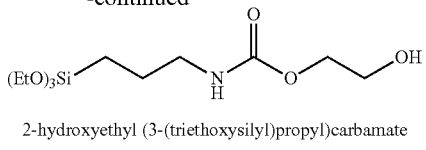

2-hydroxyethyl (3-(triethoxysilyl)propyl)carbamate

Ethylene carbonate (1.88 gr, 21.3 mmol) was added dropwise to 3-aminopropyltriethoxysilane (5.0 ml, 21.3 mmol) under nitrogen atmosphere. The solution was stirred at room temperature over night to obtain the product (2-hydroxyethyl (3-(triethoxysilyl)propyl)carbamate) as colorless oily liquid (quantitative yield).

$^1$H NMR (400 MHz, CDCl$_3$): δ 4.15-4.12 [m, 2H], 3.78 [q, J=7.0 Hz, 6H], 3.74-3.72 [m, 2H], 3.13 [t, J=6.8 Hz, 2H], 1.62-1.54 [m, 2H], 1.20 [t, J=7.0 Hz, 9H], 0.60-0.56 [m, 2H].

Step II

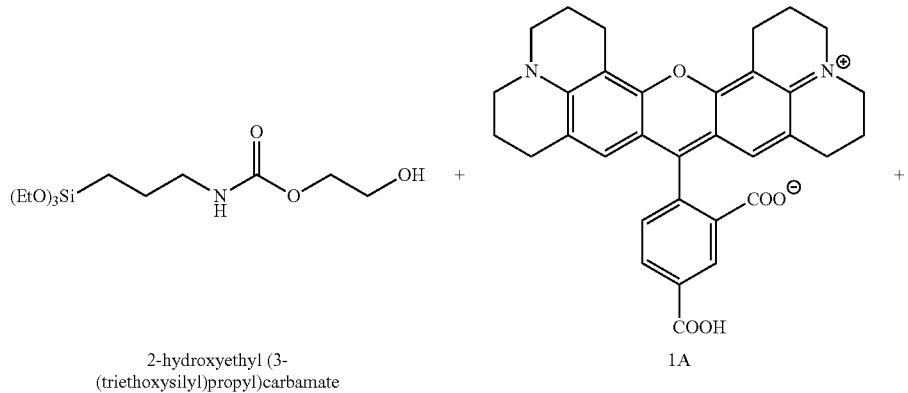

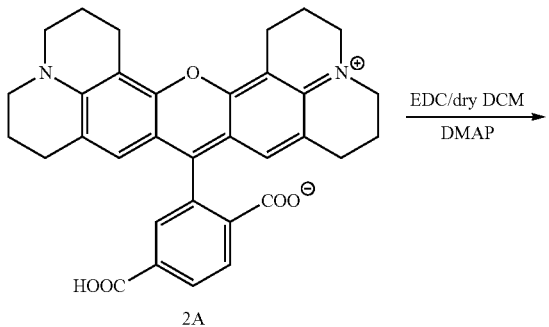

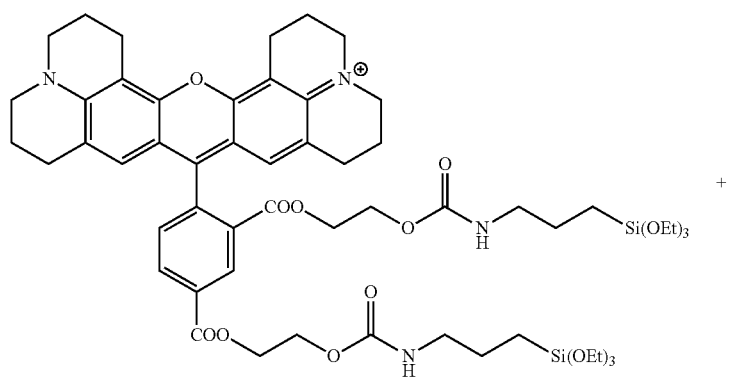

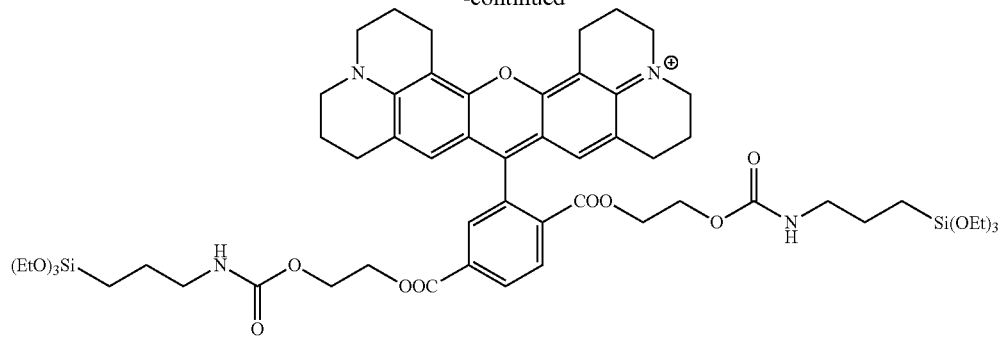

8

1A and 2A (0.20 gr, 0.37 mmol), 2-hydroxyethyl (3-(triethoxysilyl)propyl)carbamate, from step I (0.26 gr, 0.81 mmol), 1-(3-dimethylaminopropyl)-3-ethylcarbodiimide hydrochloride (0.16 gr, 0.81 mmol), 4-(dimethylamino)pyridine (0.02 gr, 0.01 mmol) were dissolved in dry dichloromethane (2.0 ml) under nitrogen atmosphere at room temperature for 24 hours. Then, the solvent was removed under reduced pressure to obtain the crude product, which was further purified by column chromatography (DCM:EtOH 4:1). The product, a mixture of 7 and 8 was obtained as a dark purple solid (yield 26%).

UV-Vis absorption: 583 nm (in EtOH)
Fluorescence emission: 608 nm (in EtOH)
FWHM=41 nm

Example 8

Synthesis of Compound 9 (X=Cl)

Step 1

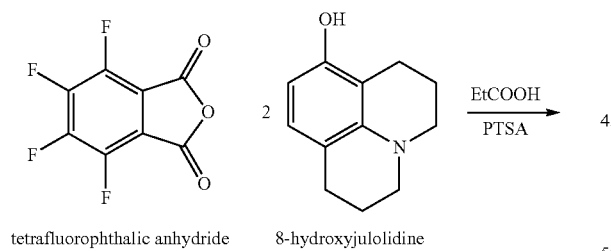

tetrafluorophthalic anhydride    8-hydroxyjulolidine

8-Hydroxyjulolidine (0.8 gr, 4.2 mmol), tetrafluorophthalic anhydride (0.614 gr, 2.8 mmol) and p-toluene sulfonic acid monohydrate (0.06 gr, 0.3 mmol) were dissolved in propionic acid (1.0 ml) under nitrogen atmosphere. The reaction was heated to reflux overnight. After cooling to room temperature, the solvent was removed under reduced pressure. The crude product was further purified using flash chromatography (DCM:MeOH 9:1). The pure product was obtained as dark purple solid (yield 33%).

UV-Vis absorption: 590 nm (in EtOH)
Fluorescence emission: 613 nm (in EtOH)
FWHM=30 nm $^1$H NMR (400 MHz, CDCl$_3$): δ 6.98 [s, 2H], 3.49-3.37 [m, 6H], 3.23-3.14 [m, 2H], 2.96-2.69 [m, 8H], 2.10-2.01 [m, 4H], 1.98-1.86 [m, 4H].

$^{19}$F NMR: δ −138.95, −140.50, −153.29, −159.22.

Step 2

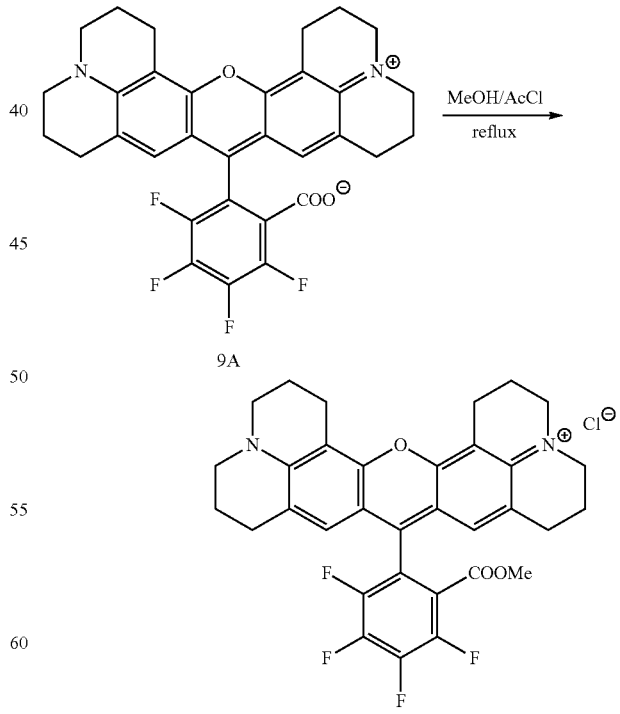

9A (0.219 gr, 0.39 mmol) was dissolved in methanol (55.0 ml) under nitrogen atmosphere. Acetyl chloride (1.8 ml, 2.5 mmol) was added dropwise at room temperature and the solution was heated to reflux. The solution was kept at reflux for 7 days in which fresh portions of acetyl chloride (0.35 ml, 5.0 mmol) were added twice a day. Then the solvent was removed under reduced pressure and the crude product was further purified using flash chromatography (DCM:MeOH 8:1). The pure product was obtained as dark purple solid (yield 51%).

UV-Vis absorption: 600 nm (in EtOH)

Fluorescence emission: 622 nm (in EtOH)

FWHM=38 nm $^1$H NMR (400 MHz, CDCl$_3$): δ 7.49-7.43 [m, 2H], 7.13-7.06 [m, 2H], 6.95 [s, 2H], 3.54 [s, 3H], 3.54-3.48 [m, 8H], 2.95 [t, J=6.20 Hz, 4H], 2.70-2.66 [m, 4H], 2.26 [s, 3H], 2.01-1.96 [m, 4H], 1.89-1.83 [m, 4H].

$^{19}$F NMR: δ −136.26, −137.60, −149.06, −153.19.

Example 9

Synthesis of Compound 9 (X═I)

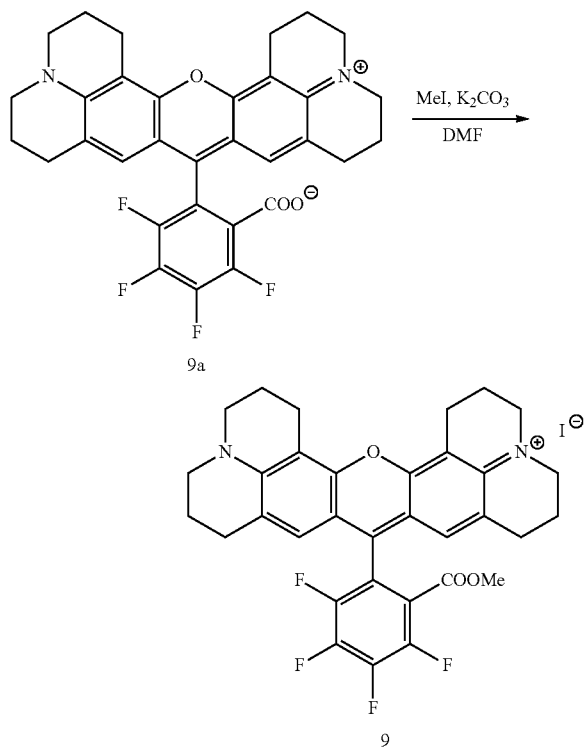

Compound 9a. (0.20 gr, 0.35 mmol) was dissolved in dry DMF (3.0 ml) under nitrogen atmosphere. Potassium carbonate (0.15 gr, 1.06 mmol) was added followed by MeI (66 μl, 1.06 mmol). The mixture was stirred for 1 hour at room temperature. Upon completion, the mixture was diluted with DCM and washed with brine. The organic layer was separated, dried with sodium sulfate, and the solvent was evaporated under reduced pressure. The crude was purified by column chromatography (10% MeOH/DCM) to give a dark blue solid (71% yield).

$^1$H NMR (400 MHz, CDCl$_3$): δ 6.93 [s, 2H], 3.54-3.49 [m, 8H], 3.54 [s, 3H], 2.96 [t, J=6.04 Hz, 4H], 2.71-2.66 [m, 4H], 2.02-1.96 [m, 4H], 1.89-1.83 [m, 4H].

$^{19}$F NMR: δ −136.22, −137.60, −149.06, −153.19.

UV-Vis absorption: 597 nm (in EtOH)

Fluorescence emission: 623 nm (in EtOH)

FWHM=36 nm

Example 10

Synthesis of Compound 10

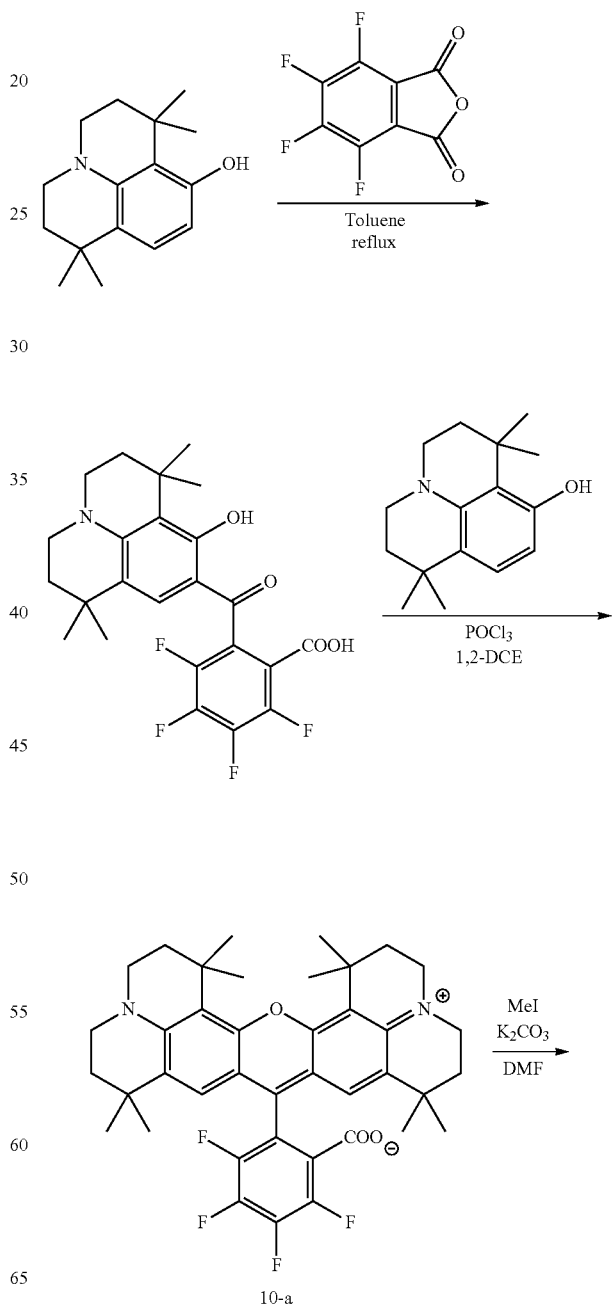

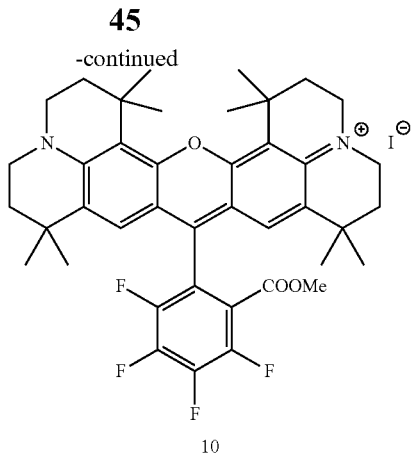

1,1,7,7-Tetramethyl-8-hydroxyjulolidine (0.3 gr, 1.22 mmol) and tetrafluorophthalic anhydride (0.27 gr, 1.23 mmol) were added to toluene (4.0 ml) and heated to reflux under nitrogen atmosphere for 5 hours. After cooling to room temperature, DCM (50 ml) and SiO$_2$ (0.25 gr) were added. The mixture was stirred for 5 minutes, then was filtered and evaporated to dryness, to give a brown solid (~0.50 gr). The solid was dissolved in 1,2-dichloroethane (13.0 ml) and POCl$_3$ (0.4 ml, 4.28 mmol) was added. The mixture was stirred at room temperature under nitrogen atmosphere for 15 minutes, then 1,1,7,7-Tetramethyl-8-hydroxyjulolidine (0.26 gr, 1.07 mmol) was added. The mixture was heated to 65° C. and stirred for 4 hours. After cooling the crude mixture to room temperature, water (43.0 ml) with sodium bicarbonate (1.0 gr) was added and stirred for 1 hour. The organic layer was separated, dried with sodium sulfate, filtered and then evaporated to dryness under reduced pressure. The crude was purified by column chromatography (100% EtOAc, then 5% MeOH/DCM to 15% MeOH/DCM) to give a dark blue solid (120 mg, 17% yield).

120 mg of the product, 10a (0.17 mmol) were dissolved in dry DMF (4.0 ml), then potassium carbonate (0.072 gr, 0.52 mmol) was added followed by MeI (64 µl, 1.04 mmol) and the mixture was stirred for 1 hour at room temperature. The mixture was diluted with DCM and washed with brine. The organic layer was separated, dried with sodium sulfate, filtered and evaporated to dryness under reduced pressure. The crude was purified by column chromatography (100% EtOAc, then 5% MeOH/DCM to 15% MeOH/DCM) to give a dark blue solid (55% yield).

$^1$H-NMR (400 MHz, DMSO-d$_6$): δ 6.87 [s, 2H], 3.62 [t, J=6.0 Hz, 4H], 3.57 [t, J=6.0 Hz, 4H], 3.48 [s, 3H], 1.84 [t, J=6.0 Hz, 4H], 1.70[t, J=6.0 Hz, 4H], 1.65 [s, 12H], 1.15 [s, 12H].

$^{19}$F-NMR: δ −82.22, −136.62, −148.82, −151.26.

UV-Vis absorption: 604 nm (in EtOH).

Fluorescence emission: 621 nm (in EtOH).

FWHM=40 nm.

Example 11

Synthesis of Compound 11a

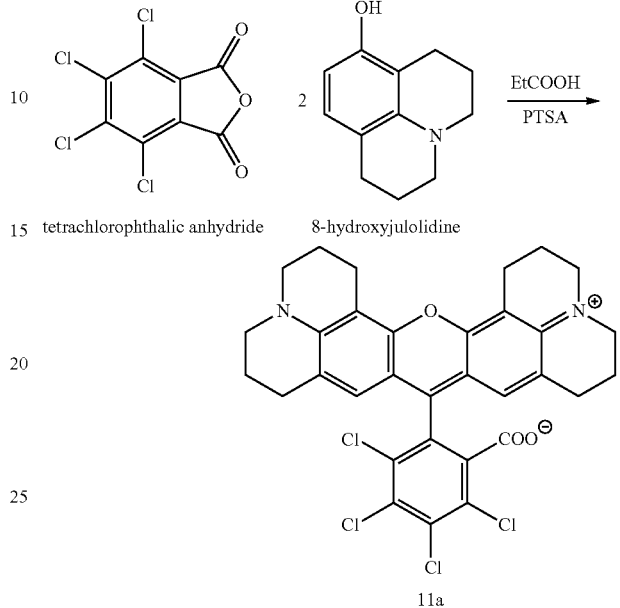

8-Hydroxyjulolidine (0.4 gr, 2.1 mmol), tetrachlorophthalic anhydride (0.38 gr, 1.32 mmol) and p-toluene sulfonic acid monohydrate (0.02 gr, 0.11 mmol) were dissolved in propionic acid (3.0 ml) under nitrogen atmosphere. The reaction was heated to reflux for 6 days. After cooling to room temperature, the solvent was removed under reduced pressure. The crude product was further purified using flash chromatography (DCM:MeOH 9:1). The pure product was obtained as dark purple solid 11-a (yield 24%).

$^1$H NMR (400 MHz, DMSO-d6): δ 6.64 [s, 2H], 3.43-3.37 [m, 8H], 2.94-2.89 [m, 4H], 2.66-2.62 [m, 4H], 2.01-1.95 [m, 4H], 1.86-1.80 [m, 4H].

UV-Vis absorption: 594 nm (in EtOH)

Fluorescence emission: 609 nm (in EtOH)

FWHM=33 nm

Example 12

Synthesis of Compound 11

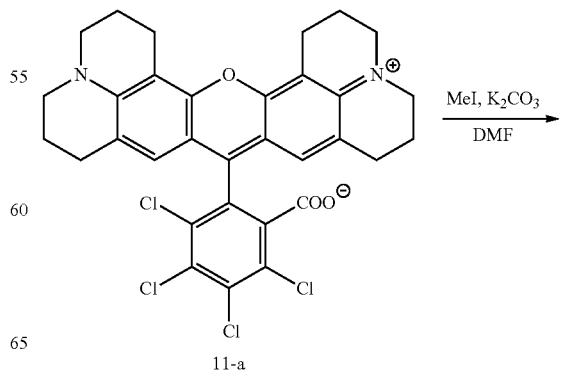

-continued

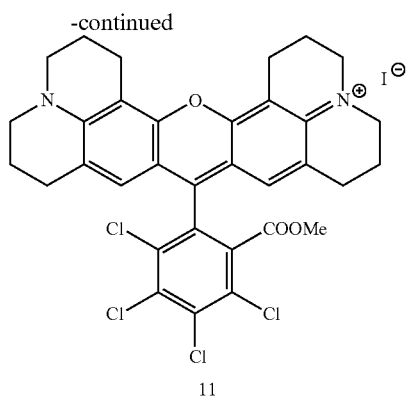

11

Compound 11a (0.35 gr, 0.56 mmol) was dissolved in dry DMF (6.0 ml) under nitrogen atmosphere. Potassium carbonate (0.24 gr, 1.67 mmol) was added followed by MeI (0.1 ml, 1.67 mmol). The mixture was stirred for 1 hour at room temperature. Upon completion, the mixture was diluted with DCM and washed with brine. The organic layer was separated, dried with sodium sulfate, and the solvent was evaporated under reduced pressure. The crude was purified by column chromatography (DCM:MeOH 9:1) to give a dark brown solid 11 (70% yield).

$^1$H NMR (400 MHz, DMSO-d6): δ 6.92 [s, 2H], 3.54-3.49 [m, 8H], 3.41 [s, 3H], 2.94 [t, J=6.16 Hz, 4H], 2.72-2.68 [m, 4H], 2.02-1.96 [m, 4H], 1.89-1.83 [m, 4H].

UV-Vis absorption: 606 nm (in EtOH)
Fluorescence emission: 623 nm (in EtOH)
FWHM=34 nm While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A photoluminescent compound represented by the structure of formula (I):

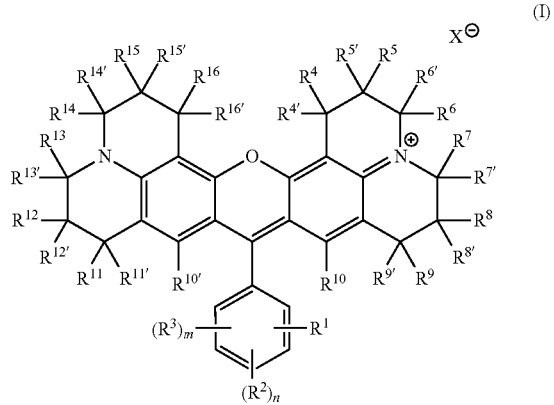

wherein
$R^1$ is COOZ, $NO_2$, COR, COSR, or CN;
$R^2$ each is independently selected from H, halide, COR, CN, NCO, NCS and COOZ;
$R^3$ each is independently selected from H, halide, COR, CN, NCO, NCS, OR, SR, $SO_3H$, $SO_3M$ and COOZ;
$R^4$-$R^{16}$ and $R^{4'}$-$R^{16'}$ are each independently selected from H, alkyl, cycloalkyl, heterocycloalkyl, aryl, benzyl, halide, $NO_2$, OR, $N(R)_2$, COR, $CON(R)_2$, CO(N-heterocycle) and COOR;
R is H, alkyl, cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
Z is unsubstituted alkyl, or cycloalkyl, heterocycloalkyl, aryl, benzyl, —$(CH_2CH_2O)_rCH_2CH_2OH$, —$(CH_2)_pOC(O)NH(CH_2)_qSi(Oalkyl)_3$, —$(CH_2)_pOC(O)CH=CH_2$ or —$(CH_2)_pSi(Oalkyl)_3$;
M is a monovalent cation;
n and m are each independently an integer between 1-4;
p and q is each independently an integer between 1-6;
r is an integer between 0-10;
and
X is an anion;
wherein if $R^2$ and $R^3$ are hydrogens (H), then $R^1$ is not COOZ.

2. The photoluminescent compound of claim 1, wherein said compound is represented by the structure of formula (II):

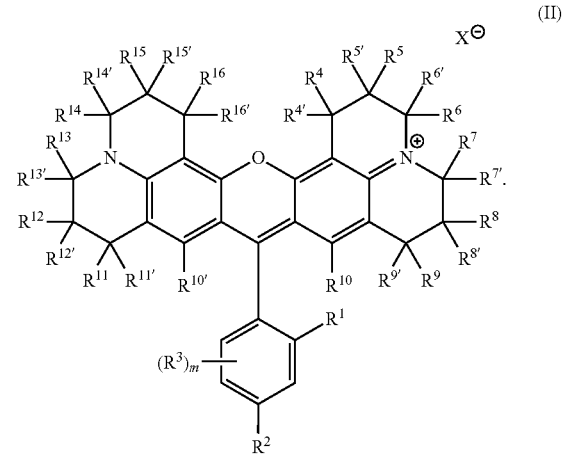

3. The photoluminescent compound of claim 1, wherein said compound is represented by the structure of formula (III):

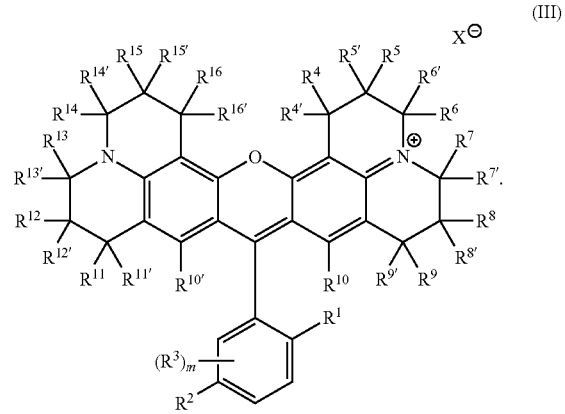

4. The photoluminescent compound of claim 1, wherein said anion is a sulfate, chloride, bromide, iodide, perchlorate, nitrate, trifluoroacetate, hydroxide, hydrosulfide, sulfide, nitrite, carboxylate, dicarboxylate, sulfonate, tetraflouroborate hexaflourophosphate, hypophosphite, phosphate, phosphite, cyanate, cyanide, isocyanate, thiocyanate, tetralkylborates, tetraarylborates or chromate.

5. A photoluminescent device comprising a color-conversion-layer comprising a photoluminescent compound according to claim 1.

6. A photoluminescent device comprising a color-conversion-layer comprising a photoluminescent compound according to claim 2.

7. A photoluminescent device comprising a color-conversion-layer comprising a photoluminescent compound according to claim 3.

8. The photoluminescent device of claim 5, wherein said anion is a sulfate, chloride, bromide, iodide, perchlorate, nitrate, trifluoroacetate, hydroxide, hydrosulfide, sulfide, nitrite, carboxylate, dicarboxylate, sulfonate, tetraflouroborate hexaflourophosphate, hypophosphite, phosphate, phosphite, cyanate, cyanide, isocyanate, thiocyanate, tetralkylborates, tetraarylborates or chromate.

9. The photoluminescent device of claim 5 wherein said color-conversion-layer is in a form of a film.

10. The photoluminescent device of claim 5, wherein said device is integrated in a display device.

11. The photoluminescent device of claim 9, wherein said device is integrated in a display device.

* * * * *